United States Patent
DeYong et al.

(10) Patent No.: US 6,614,925 B2
(45) Date of Patent: Sep. 2, 2003

(54) SYSTEM AND METHOD FOR PERFORMING BASIC TRAINING

(75) Inventors: Mark R. DeYong, Round Rock, TX (US); Jeff E. Newberry, Pflugerville, TX (US); John W. Grace, Austin, TX (US); Thomas C. Eskridge, Austin, TX (US)

(73) Assignee: Intelligent Reasoning Systems, Inc., Round Rock, TX (US)

( * ) Notice: Subject to any disclaimer, the term of this patent is extended or adjusted under 35 U.S.C. 154(b) by 0 days.

(21) Appl. No.: 10/127,654

(22) Filed: Apr. 22, 2002

(65) Prior Publication Data

US 2003/0053677 A1 Mar. 20, 2003

Related U.S. Application Data

(62) Division of application No. 09/363,004, filed on Jul. 28, 1999.

(51) Int. Cl.[7] ................................................. G06K 9/00
(52) U.S. Cl. .................. 382/149; 382/147; 382/155; 382/171; 382/190; 382/225; 382/276; 382/305; 716/19
(58) Field of Search .............................. 382/147, 149, 382/151, 173, 190, 176, 181, 201, 213, 225, 226, 276, 155, 195, 199, 209, 229, 305; 702/35; 716/15, 19; 348/92

(56) References Cited

U.S. PATENT DOCUMENTS

| | | | |
|---|---|---|---|
| 4,978,224 A | * 12/1990 | Kishimoto et al. | ......... 382/145 |
| 5,204,911 A | 4/1993 | Schwartz et al. | |
| 5,517,234 A | 5/1996 | Gerber et al. | |
| 5,586,058 A | 12/1996 | Aloni et al. | |
| 5,638,465 A | 6/1997 | Sano et al. | |
| 6,122,397 A | * 9/2000 | Lee et al. | ................ 382/149 |

FOREIGN PATENT DOCUMENTS

WO    WO 96/02897    2/1996

OTHER PUBLICATIONS

"Component Placement Verification Through Height Discontinuities" IBM Technical Disclosure Bulletin, New York, vol. 29, No. 5, Oct. 1, 1986, pp. 2216–2223.

Moganti et al., "A Modular Approach to Automatic Printed Circuit Board Inspection," Proceedings of the SPIE, Jan. 31, 1996, pp. 200–208.

Heckbert, "Color Image Quantization for Frame Buffer Display" Computer Graphics, vol. 16, No. 3, pp. 297–305, Jul. 1982.

* cited by examiner

Primary Examiner—Jayanti K. Patel
Assistant Examiner—Sheela Chawan
(74) Attorney, Agent, or Firm—Gray Cary Ware & Freidenrich LLP

(57) ABSTRACT

A system and method for performing basic training in a dynamic image recognition system, including collecting raw image data on a blank object, segmenting out a region of interest on the object, performing spatial image transforms to generate a set of derived spaces for the region of interest, generating a set of presence/absence features for the object by creating a set of presence/absence features, representing each significant presence/absence feature as one or more presence/absence boxes, building a blank object presence/absence score set, building an assembled board presence/absence score set, building a presence/absence knowledge base using the blank object presence/absence score set and the assembled object presence absence score set, and pruning each presence/absence box. The system and method further includes generating a set of polarity features from a first assembled object.

17 Claims, 19 Drawing Sheets $P_1 \neq P_2 \neq P_3 \neq P_T$
$P'_3 = a_3 P_3 + b_3 = P_T$
$P'_2 = a_2 P_2 + b_2 = P_T$
$P'_1 = a_1 P_1 + b_1 = P_T$
$P'_1 = P'_2 = P'_3 = P_T$
$\bar{a} = [a_1, a_2, a_3, ..., a_N]^T$
$\bar{b} = [b_1, b_2, b_3, ..., b_N]^T$

|  | 0 | 1 | 2 | 3 | 4 | 5 | 6 | 7 | 8 | 9 |
|---|---|---|---|---|---|---|---|---|---|---|
| (i) 0 | 0 | 0 | 0 | 0 | 0 | 0 | 2 | 2 | 2 | 0 |
| 1 | 0 | 0 | 1 | 1 | 1 | 1 | 1 | 1 | 2 | 0 |
| 2 | 0 | 0 | 1 | 1 | 1 | 1 | 1 | 1 | 2 | 0 |
| 3 | 0 | 0 | 1 | 1 | 3 | 3 | 3 | 3 | 2 | 0 |
| 4 | 0 | 0 | 1 | 1 | 3 | 3 | 3 | 3 | 2 | 0 |
| 5 | 3 | 3 | 1 | 1 | 1 | 1 | 3 | 3 | 2 | 0 |
| 6 | 3 | 3 | 1 | 1 | 1 | 1 | 3 | 3 | 2 | 0 |
| 7 | 3 | 3 | 3 | 3 | 3 | 3 | 3 | 3 | 2 | 0 |
| 8 | 3 | 3 | 3 | 3 | 3 | 3 | 3 | 3 | 2 | 0 |
| 9 | 1 | 1 | 1 | 1 | 1 | 1 | 1 | 1 | 1 | 1 |

0-55 gℓ → 0
56-130 gℓ → 1       } 19 GRAYSCALE REDUCTION TRANSFORM
131-195 gℓ → 2
196-255 gℓ → 3

|  | 0 | 1 | 2 | 3 | 4 | 5 | 6 | 7 | 8 | 9 |
|---|---|---|---|---|---|---|---|---|---|---|
| (i) 0 | 7 | 6 | 0 | 4 | 4 | 0 | 4 | 6 | 5 | 0 |
| 1 | 0 | 4 | 6 | 1 | 1 | 1 | 1 | 0 | 3 | 0 |
| 2 | 6 | 6 | 4 | 3 | 2 | 1 | 2 | 1 | 3 | 0 |
| 3 | 0 | 4 | 1 | 4 | 1 | 1 | 1 | 1 | 3 | 2 |
| 4 | 2 | 1 | 1 | 1 | 1 | 7 | 6 | 5 | 5 | 0 |
| 5 | 2 | 1 | 1 | 1 | 1 | 0 | 4 | 3 | 3 | 2 |
| 6 | 2 | 3 | 2 | 1 | 0 | 2 | 1 | 8 | 3 | 0 |
| 7 | 3 | 3 | 2 | 1 | 1 | 1 | 1 | 8 | 3 | 0 |
| 8 | 7 | 6 | 8 | 7 | 6 | 6 | 6 | 6 | 3 | 2 |
| 9 | 0 | 4 | 5 | 0 | 4 | 4 | 0 | 4 | 3 | 2 |

DIRECTION CODE MAP

```
1 2 3
4 0 5
6 7 8
```

FIRST CODE$_{ij}$ = DIRECTION OF MIN $\{-\Delta P_{k\ell} \in N_{ij}\}$ $N_{ij}$ => i ± 1, j ± 1

FIRST ORDER REDUCTION MAP $$P'(i,j) = \text{MAX}\{P_{ij} - P_{k\ell \in N_{ij}}\} \quad N_{ij} \quad i \pm 1, j \pm 1$$

$P''(i,j) = MAX \{P'_{ij} - P'_{k\ell \in N_{ij}}\}$  $N_{ij} => i \pm 1, j \pm 1$

SECOND ORDER REDUCTION MAP

DIRECTION CODE MAP

```
     1 2 3
26→  4 0 5      SECOND CODEᵢⱼ = DIRECTION OF MIN {−ΔP'ₖₗ∈Nᵢⱼ}
     6 7 8                  Nᵢⱼ => i ± 1, j ± 1
```

|   | 0 | 1 | 2 | 3 | 4 | 5 | 6 | 7 | 8 | 9 |
|---|---|---|---|---|---|---|---|---|---|---|
| 0 | 0 | 0 | 0 | 0 | 0 | 0 | 2 | 2 | 2 | 0 |
| 1 | 0 | 0 | 1 | 1 | 1 | 1 | 1 | 1 | 2 | 0 |
| 2 | 0 | 0 | 1 | 1 | 1 | 1 | 1 | 2 | 2 | 0 |
| 3 | 0 | 0 | 1 | 1 | 3 | 3 | 3 | 2 | 2 | 0 |
| 4 | 0 | 0 | 1 | 1 | 3 | 3 | 3 | 2 | 2 | 0 |
| 5 | 3 | 3 | 1 | 1 | 1 | 1 | 3 | 3 | 2 | 0 |
| 6 | 3 | 3 | 1 | 1 | 1 | 1 | 3 | 3 | 2 | 0 |
| 7 | 3 | 3 | 3 | 3 | 3 | 3 | 3 | 3 | 2 | 0 |
| 8 | 3 | 3 | 3 | 3 | 3 | 3 | 3 | 3 | 2 | 0 |
| 9 | 1 | 1 | 1 | 1 | 1 | 1 | 1 | 1 | 1 | 1 |

|   | 0 | 1 | 2 | 3 | 4 | 5 | 6 | 7 | 8 | 9 |
|---|---|---|---|---|---|---|---|---|---|---|
| 0 | 0 | 0 | 0 | 0 | 0 | 0 | 2 | 2 | 2 | 0 |
| 1 | 0 | 0 | 1 | 1 | 1 | 1 | 1 | 1 | 2 | 0 |
| 2 | 0 | 0 | 1 | 1 | 1 | 1 | 1 | 1 | 2 | 0 |
| 3 | 0 | 0 | 1 | 1 | 3 | 3 | 3 | 3 | 2 | 0 |
| 4 | 0 | 0 | 1 | 1 | 3 | 3 | 3 | 3 | 2 | 0 |
| 5 | 3 | 3 | 1 | 1 | 1 | 1 | 3 | 3 | 2 | 0 |
| 6 | 3 | 3 | 1 | 1 | 1 | 1 | 3 | 3 | 2 | 0 |
| 7 | 3 | 3 | 3 | 3 | 3 | 3 | 3 | 3 | 2 | 0 |
| 8 | 3 | 3 | 3 | 3 | 3 | 3 | 3 | 3 | 2 | 0 |
| 9 | 1 | 1 | 1 | 1 | 1 | 1 | 1 | 1 | 1 | 1 |

|   | 0 | 1 | 2 | 3 | 4 | 5 | 6 | 7 | 8 | 9 |
|---|---|---|---|---|---|---|---|---|---|---|
| 0 | 0 | 0 | 0 | 0 | 0 | 0 | 2 | 2 | 2 | 0 |
| 1 | 0 | 0 | 1 | 1 | 1 | 1 | 1 | 1 | 2 | 0 |
| 2 | 0 | 0 | 1 | 1 | 1 | 1 | 1 | 1 | 2 | 0 |
| 3 | 0 | 0 | 1 | 1 | 3 | 3 | 3 | 3 | 2 | 0 |
| 4 | 0 | 0 | 1 | 1 | 3 | 3 | 3 | 3 | 2 | 0 |
| 5 | 3 | 3 | 1 | 1 | 1 | 1 | 3 | 3 | 2 | 0 |
| 6 | 3 | 3 | 1 | 1 | 1 | 1 | 3 | 3 | 2 | 0 |
| 7 | 3 | 3 | 3 | 3 | 3 | 3 | 3 | 3 | 2 | 0 |
| 8 | 3 | 3 | 3 | 3 | 3 | 3 | 3 | 3 | 2 | 0 |
| 9 | 1 | 1 | 1 | 1 | 1 | 1 | 1 | 1 | 1 | 1 |

|   | 0 | 1 | 2 | 3 | 4 | 5 | 6 | 7 | 8 | 9 |
|---|---|---|---|---|---|---|---|---|---|---|
| 0 | 0 | 0 | 0 | 0 | 0 | 0 | 2 | 2 | 2 | 0 |
| 1 | 0 | 0 | 1 | 1 | 1 | 1 | 1 | 1 | 2 | 0 |
| 2 | 0 | 0 | 1 | 1 | 1 | 1 | 1 | 1 | 2 | 0 |
| 3 | 0 | 0 | 1 | 1 | 3 | 3 | 3 | 3 | 2 | 0 |
| 4 | 0 | 0 | 1 | 1 | 3 | 3 | 3 | 3 | 2 | 0 |
| 5 | 3 | 3 | 1 | 1 | 1 | 1 | 3 | 3 | 2 | 0 |
| 6 | 3 | 3 | 1 | 1 | 1 | 1 | 3 | 3 | 2 | 0 |
| 7 | 3 | 3 | 3 | 3 | 3 | 3 | 3 | 3 | 2 | 0 |
| 8 | 3 | 3 | 3 | 3 | 3 | 3 | 3 | 3 | 2 | 0 |
| 9 | 1 | 1 | 1 | 1 | 1 | 1 | 1 | 1 | 1 | 1 |

Labels across top (j →): 0, 1, 2, 3, 4, 5, 6, 7, 8, 9
Region labels: #1-1 (cols 0-1), #4 (col 2), 88, #1-2 (cols 3-5), #2 (col 8), #3 (col 9, label 58), #5 (rows 5-8, left), #6 (row 9), 86

| (i) | 0 | 1 | 2 | 3 | 4 | 5 | 6 | 7 | 8 | 9 |
|---|---|---|---|---|---|---|---|---|---|---|
| 0 | 0 | 0 | 0 | 0 | 0 | 0 | 2 | 2 | 2 | 0 |
| 1 | 0 | 0 | 1 | 1 | 1 | 1 | 1 | 1 | 2 | 0 |
| 2 | 0 | 0 | 1 | 1 | 1 | 1 | 1 | 1 | 2 | 0 |
| 3 | 0 | 0 | 1 | 1 | 3 | 3 | 3 | 3 | 2 | 0 |
| 4 | 0 | 0 | 1 | 1 | 3 | 3 | 3 | 3 | 2 | 0 |
| 5 | 3 | 3 | 1 | 1 | 1 | 1 | 3 | 3 | 2 | 0 |
| 6 | 3 | 3 | 1 | 1 | 1 | 1 | 3 | 3 | 2 | 0 |
| 7 | 3 | 3 | 3 | 3 | 3 | 3 | 3 | 3 | 2 | 0 |
| 8 | 3 | 3 | 3 | 3 | 3 | 3 | 3 | 3 | 2 | 0 |
| 9 | 1 | 1 | 1 | 1 | 1 | 1 | 1 | 1 | 1 | 1 |

FIG. 20

Labels across top (j →): 0, 1, 2, 3, 4, 5, 6, 7, 8, 9
Region labels: #1-1 (cols 0-1), #1-2 (cols 3-4), #4 (col 5), #2 (col 8), #3 (col 9, label 62), #5, #6

| (i) | 0 | 1 | 2 | 3 | 4 | 5 | 6 | 7 | 8 | 9 |
|---|---|---|---|---|---|---|---|---|---|---|
| 0 | 0 | 0 | 0* | 0 | 0 | 0 | 2 | 2 | 2 | 0 |
| 1 | 0 | 0 | 1 | 1 | 1 | 1 | 1 | 1 | 2 | 0 |
| 2 | 0 | 0 | 1 | 1 | 1 | 1 | 1 | 1 | 2 | 0 |
| 3 | 0 | 0 | 1 | 1 | 3 | 3 | 3 | 3 | 2 | 0 |
| 4 | 0 | 0 | 1 | 1 | 3 | 3 | 3 | 3 | 2 | 0 |
| 5 | 3 | 3 | 1 | 1 | 1 | 1 | 3 | 3 | 2 | 0 |
| 6 | 3 | 3 | 1 | 1 | 1 | 1 | 3 | 3 | 2 | 0 |
| 7 | 3 | 3 | 3 | 3 | 3 | 3 | 3 | 3 | 2 | 0 |
| 8 | 3 | 3 | 3 | 3 | 3 | 3 | 3 | 3 | 2 | 0 |
| 9 | 1 | 1 | 1 | 1 | 1 | 1 | 1 | 1 | 1 | 1 |

ASSESS INDIVIDUAL FEATURE RELATIVE CONFIDENCES
W.R.T. SPATIAL LOCATIONS AND GROUPINGS.

FIG. 27A

| GENERATING THE FEATURE SPACES |
|---|
| Images are scaled by an integer amount so max axis size is > 100 and <= 200<br>All 5 images are generated (mag0, dir1, mag1, dir2, mag2)<br>colors on mag images are reduced to mag0(12,8), mag1(12,0), mag2(12,0)<br>    (number of colors, min distance between colors) |
| COLOR REDUCTION (N,X) |
| Generate histogram of image<br>find the N best colors<br>    start with one color group that represents the complete histogram<br>    while colors < N<br>        find the color group with the most pixels<br>        split color group so that half of the pixels are on each side<br>    compute the weighted average color for each color group<br>compress neighboring colors whose distance is less than X |
| GENERATING THE FEATURES |
| cluster the image<br>for each cluster<br>    if a cluster is < 25 it is thrown out<br>    find the cluster's bounding box and the gray value<br>    generate boxes to represent the cluster<br>        while still shrinking box<br>            compute edge ratio for all four edges<br>            choose the edge with the minimum ratio, if tie choose random<br>            if the cluster fill ratio < 75% or chosen edge ratio is < 25%<br>                shrink the box along the chosen edge<br>            if the clusterSizeRatio < 75%<br>                use the box we started with and stop shrinking process<br>        if box size > 4050<br>            divide box along longer axis<br>            if the boxes > 25<br>                send the boxes to the generate boxes code<br>        else<br>            add the new box as a feature<br>generate luts for grayscale images<br>    find the minimum and maximum gray value in the image<br>    for each color used in the image<br>        generate a scoring function for gray values<br>            minGray = halfway between color N-1 and N<br>            maxGray = halfway between color N and N+1<br>            ramp from 0 to 5 starting at minGray -5 to minGray<br>            5 from minGray to maxGray<br>            ramp from 5 to 0 starting at maxGray to maxGray +5<br>prune the features<br>for each feature, compute the distance between class x and class y<br>    distance = minimum of {(mean of class x - mean of class y)/std dev of class x,<br>    (mean of class x - mean of class y)/std dev of class y}<br>sort features by distance: maximum distance --> minimum distance<br>keep up to 50 top features (maximum distances) if distance > 0.5 |

FROM FIG. 27A

| GENERATING A FEATURE VECTOR |
|---|
| for each ROI, score the features in the corresponding pruned feature set, this set of scores form the feature vector<br>    FIRST and SECOND DIRECTION CODE features:<br>      score = count of matching code pixels divided by feature area<br>    INITIAL, FIRST, and SECOND REDUCED MAGNITUDE CODE features:<br>      scoring method shown in Figure 8 |
| GENERATING A CLASSIFICATION |
| for each feature vector<br>    compute the flex distance = the euclidean distance of closest training sample feature from classification set<br>best = classification with closest distance (on a per feature basis) --> flex distance<br>nextBest = closest classification from the other major classes<br>decision confidence = flex distance of nextBest/(flex distance of nextBest + flex distance of best) |
| PERFORM RELATIVE CONFIDENCE ANALYSIS |
| relative confidence analysis<br>for each ROI, store decision confidences in a FIFO floating window 100 samples wide<br>compute the upper and lower relative confidence bounds over the window<br>(active samples in window <= 100)<br>    upper bound = mean + 2 * std dev      lower bound = mean - 2 * std dev<br>for each decision, flag as a relative confidence violation if<br>    decision confidence > upper bound or < lower bound<br>if ROI has an actual relative confidence violation,<br>    do not add the current decision confidence to the window<br>if ROI does not actually have a relative confidence violation,<br>    do add the current decision confidence to the window |
| PERFORM EXTENDED RELATIVE CONFIDENCE ANALYSIS |
| extended relative confidence analysis<br>use relative confidence analysis procedure #2 for each feature within the ROI as well as the ROI<br>determine if current feature and ROI decision confidences exceed their respective upper and lower bounds<br>cluster features with similar confidence violations (magnitude, class, bound violated, spatial proximity)<br>apply heuristic rules to clusters to determine P/A subclassification |

SYSTEM AND METHOD FOR PERFORMING BASIC TRAINING

RELATED APPLICATION

This application is a division of U.S. patent application Ser. No. 09/363,004 by inventors Mark R. DeYong, Jeff E. Newberry, John W. Grace and Thomas C. Eskridge entitled "SYSTEM AND METHOD FOR DYNAMIC IMAGE RECOGNITION" filed on Jul. 28, 1999, and hereby incorporates that application by reference in entirety as if it had been fully set forth herein.

TECHNICAL FIELD OF THE INVENTION

The present invention relates generally to the fields of image processing, pattern recognition, and machine vision, and more particularly, to a system and method, including software programming, for automated dynamic image recognition for the detection and classification of defects on printed wiring boards using visual imaging and analyses of the visual imaging.

BACKGROUND OF THE INVENTION

Most manufactured products go through quality control inspection cycles in an attempt to reduce the number of defective products that leave the manufacturing facility. Especially in industries incorporating electronic printed wiring assemblies (PWAs), visual inspections are often performed at several points in the manufacturing cycle of the PWA. For PWA inspections, component level defects that are examined for by visual inspection include missing, misoriented, misaligned, damaged components, and foreign material.

Automated inspection of objects, including PWAs, has been tried in many manufacturing industries to attempt to 1) reduce the number of defects that escape detection and false defects reported in human visual inspections, 2) reduce the time required to perform inspections and therefore reduce the overall manufacturing cycle time, and 3) to reduce the labor costs associated with manual visual inspections. Machine vision systems have become more widespread in industries requiring rapid inspection of objects to determine whether the object is spacially correct. Several automated inspection methodologies have been commercialized, with varying degrees of success, for PWA inspection to detect component level defects. These include golden board correlation, template correlation, pattern recognition with fixed feature sets, and statistical feature models. Very often, specialized hardware and software techniques are used in conjunction with these methods to increase the proficiency of these methodologies.

However, each of these previously developed methodologies proves inadequate in a real world inspection scenario because each are predisposed to the visual characteristics of their "good board" models (e.g., geometric patterns or statistical models). Thus, in order to maintain effective defect detection, the PWAs inspected must remain fairly consistent. However, the image of a PWA and particular areas of a "good" PWA can change from run to run and even within a single run of boards (e.g., if a different vendor component is used). In reality, there are countless variations of PWAs that are correctly assembled. These conventional systems do not adequately compensate for the real world variations that will still result in a good board.

Furthermore, each of these previously developed systems and methods require an extensive amount of programming expertise to set up and maintain the inspection systems. The programming must typically include elaborate image processing algorithm configurations for each new part, which, depending on the algorithm used, can include as many as 150 distinct parameters. Typically, these complex problems cannot automatically switch between part types, the part libraries cannot be ported to new PWAs or to other inspection systems, and each new board can require in excess of 80 hours of initial set-up time.

As mentioned, specialized hardware and/or software programming is often used to reduce image variability for these previously developed inspection systems to improve the system performance. However, special hardware and/or software programming typically 1) increase the complexity for the user and 2) limit the scope of applicability for the inspection system. For example, the modifications may make one class of defect easier to detect, while reducing the effectivity or even eliminating the ability to detect other classes of defects. Thus, in order to inspect for all relevant component defects, several modifications must be made and the inspection system must image the same PWA multiple times to get full defect coverage, thus increasing both the complexity and the cost of the inspection system.

For example, some previous systems are model-based approaches that use software programming to model the object under inspection (such as a PWA with components). Model-based approaches will often build a very exact model of the components by outlining the edges of components on the PWA, perhaps including an edge-enhancement algorithm, and performing a connectivity step to form a line segment. However, as the lines (edges) become more obscure (due to gaps or less distinct gray-scale differentiation between pixels), the software programs and algorithms become significantly less effective and therefore increasingly more complex and expensive.

As shown, these previously developed inspection systems tend to be non-robust and inflexible. Accordingly, these systems consistently produce high numbers of false alarms (i.e., indicating defects when none exists) which cannot be reduced to acceptable levels without causing high numbers of false passes (i.e., indicating a PWA is good when it has component defects). In addition, these systems tend to have relatively high operating costs, maintenance costs, and operator training costs.

Additionally, previously developed machine vision inspection systems, most (if not all) simply determine whether a part is present or absent and some make a determination of polarity. However, these systems do not perform an additional analysis of the presence/absence determinations to sub-classify defects to determine not only whether the component is present, but also whether the component is misoriented, misaligned, damaged, or surrounded by foreign material. While these prior art systems can often identify a defect, they cannot classify the defect to aid in the troubleshooting and improvement of the PWA process.

SUMMARY OF THE INVENTION

The present invention provides an image recognition system and method that substantially eliminates or reduces disadvantages and problems associated with previously developed inspection systems and methods that utilize imaging technology, including those systems and methods used for inspection of printed wiring boards.

The present invention provides an image recognition program stored on a tangible medium for classifying and subclassifying regions of interest on an image. The image recognition program can be used in an image inspection system to determine defects on objects such as printed wiring boards.

More specifically, the image recognition program is executable to collect raw image data, segment out rectangular regions of interest that can be component sites defined by CAD data, preprocess each region of interest by scaling, gain and offset correction, and gamma correction, generate a set of image spaces for each region of interest using a set of spatial image transforms, generating feature scores on the image spaces, scoring the features, comparing the features to a knowledge base of feature scores to make a class determination for the features, generating a presence/absence decision confidence for the features, calculating a class determination and decision confidence for each region of interest. This will determine if the component within the region of interest is correct or defective including whether a part is present or absent and whether it has the correct polarity.

Another aspect of the image recognition software includes the ability to perform a relative confidence determination to flag defects and extended relative confidence to subclassify the defects. In another aspect of the present invention, class determination, decision confidences, relative decision confidences and extended relative decision confidences can be added to the existing knowledge base to "train" the knowledge base to accept or reject additional defect classes and subclasses.

The present invention provides an important technical advantage by providing an automated object inspection system that, in addition to determining whether a component is present and has the correct polarity, can also determine various subclassifications of defects, including missing, misoriented, misaligned, damaged components, and foreign material.

The present invention provides another important technical advantage by using software programming in combination with visual imaging of an object to perform improved defect detection on the imaged object. The unique software programming of the present invention builds knowledge bases that can be refined as additional images are processed through the system. The unique programming of the present invention also provides an analysis of the knowledge bases to provide a relative confidence analysis of whether a component on the object is present or absent.

The present invention provides a further technical advantage by performing an extended confidence analysis using software programming to provide defect sub-classification analyses.

The present invention provides another technical advantage by reducing the number of false alarm defect detections as well as the number of defect escapes (defects that pass through the inspection system.) The self-organizing knowledge bases and adaptive algorithms in the software programming enhance feature selection by using the most discriminating features to represent a defect class, rather than being predisposed by the operator as to which features should be used for defect determination. The relative confidence and extended confidence analyses of the present invention further reduce the number of defect escapes.

The present invention provides yet another technical advantage by minimizing training time of the defect detection system. The present invention can create a knowledge base more rapidly (e.g., minutes instead of hours/days for conventional systems). Furthermore, new defect classes and part types can be updated with single example incremental training, and the performance of the system improves incrementally with each additional PWA imaged. The combination of minimal knowledge base creation time with incremental training allows for a faster path to higher quality PWAs.

The present invention provides still another technical advantage minimizing the required inspection system operator skill level. The knowledge bases of the present invention are trained by showing examples of the objects to be inspected. Unlike conventional inspection systems, an operator using an inspection system incorporating the present invention does not need any image processing training, and will only require minimal system operation experience.

The present invention provides another advantage by providing extendible, low complexity, highly parallel algorithms in the software programming. The algorithms are not tailored for specific inspection applications or a particular data input, and therefore can be extended to any machine vision and input imagery applications. The relative simplicity of the algorithms provide ease of maintenance, while the parallel nature provides opportunities for increases in speed as parallel processing architectures develop. The present invention provides an inspection system that does not perform every inspection based on a set, pre-disposed model.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein:

FIG. 9 is a reduced gray scale image of the image of FIG. 7;

FIG. 11 is the first order derivative direction image as derived from the image of FIG. 8;

FIG. 13 is the second order derivative direction image as derived from the image of FIG. 10;

FIG. 14 is a first clustering image of the image of FIG. 9 to illustrate the clustering methodology of the present invention;

FIG. 15 is a first iteration clustering image of the image of FIG. 9;

FIG. 16 is a second iteration clustering image of the image of FIG. 9;

FIG. 17 is a third iteration clustering image of the image of FIG. 9;

FIG. 18 is a fourth iteration clustering image of the image of FIG. 9;

FIG. 19 is a first sub-iteration of the clustering image of FIG. 14;

FIG. 20 is a second sub-iteration of the clustering image of FIG. 14;

FIG. 27 is a listing of pseudo-code for one embodiment of the image recognition software of the present invention.

DETAILED DESCRIPTION OF THE INVENTION

Figure 1:
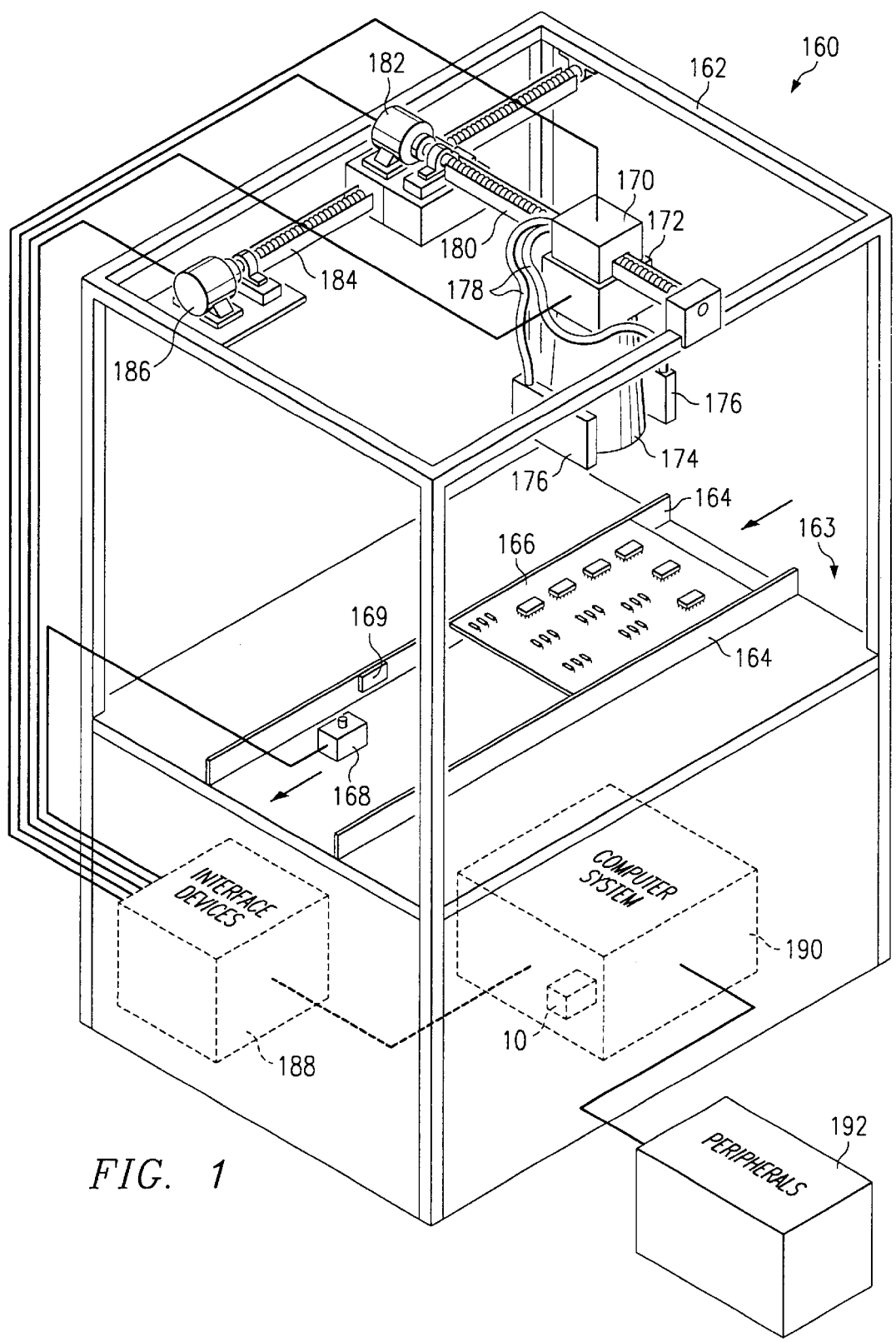
FIG. 1 is a diagram of an exemplary imaging system incorporating the image recognition software of the present invention.

Preferred embodiments of the present invention are illustrated in the FIGUREs, like numerals being used to refer to like and corresponding parts of the various drawings.

The dynamic image recognition system and method of the present invention allows for automatic detection and classification of regions of interest (ROI) on an image of an object, for example a printed wiring board (PWA) that is assembled with components. The present invention can create and interpret a unique set of visual features to describe a "good" PWA that does not contain manufacturing defects. By using a machine vision system and software programming, the present invention can use a set of visual features that is not necessarily the one most readily observed by the human visual system.

The present invention uses a machine vision system to take visual images or pictures of the object, for example a PWA, and uses image recognition software programming that is executable to build self-organizing, adaptive knowledge bases that are used to find out-of-tolerance features within the ROI's for the images on subsequent PWAs. These knowledge bases are data bases stored in computer-readable form on a computer-readable storage medium. Using software programming that is also stored on a computer-readable medium and executable using a computer processor, these out-of-tolerance ROI's are examined to determine if they represent defects on the PWAs. Each subsequent image of a PWA can be used to update and improve the existing knowledge base regarding the features and regions of interest for that particular PWA.

The visual images are initially analyzed to determine whether components on a PWA are present or absent, and if present, whether the components are assembled with the proper polarity. The polarity determination is usually made from a polarity identifier contained on the component. A decision confidence analysis can then be performed on the raw presence/absent determinations to provide a confidence level of whether the component is absent or present. The present invention can then perform relative confidence analysis for a particular class of defects to further "detect" whether a component assembled on the PWA exhibits a defect. The presence/absence confidence determinations-can then be further processed to find defect sub-classes (i.e., defects beyond simply present or absent) using what will be described herein as an extended confidence analysis. Using the extended confidence analysis methodology contained in software programming, the dynamic image recognition software of the present invention can detect and classify component level sub-class defects such as foreign material on the component, critically skewed components, damaged components, wrong components at a particular position, tombstoned components, and billboarded components. The presence/absence analysis, relative confidence analysis, and extended confidence analysis are all performed by the image recognition software programming of the present invention.

A present/absence analysis is a determination of whether a component is actually assembled (i.e., "present") on the PWA or not (i.e., "absent"). The "decision confidence" analysis is a measure of the level of confidence the present invention has in that determination. The "relative confidence" is a statistic that provides a nominal measure and a range that models how close the presence/absence decision confidences are to typical ROI decision confidences contained in the ROI knowledge base. The presence/absence relative confidence statistic provides basis to determine when images have deviated from the norm. The "extended confidence" analysis is a further determination of defect sub-classes. Thus, not only can the present invention determine that a component is present, but deviations from the image norm can also allow a determination of defects on a present component. For example, while the component may be present and have the correct polarity, the component may be critically skewed, and certain understood deviations of the extended relative confidence can lead to detection of this defect.

Using the extended confidence software programming, the present invention can subclassify defects found during the presence/absence analyses into the following component level defect subclasses: critically skewed components, tombstoned components, billboarded components, damaged components, wrong components, and foreign material on the PWA.

One of the unique aspects of the present invention is the self-organizing nature of the knowledge base analysis algorithms. The knowledge bases build up the relative confidence thresholds autonomously (i.e., no relative confidence thresholds are pre-programmed or pre-set by humans). Certain parameters can be pre-programmed to enhance the detection accuracy and speed, such as the minimal feature size. For example, the operator can set a sensitivity level (e.g., the percentage confidence that will trigger an "absent" score) to a level that is significant to the operator. In addition, the present invention allows the operator to adjust the sensitivity during inspection to overcome physical limitations of the inspection system. However, relative confidence thresholds are not preset; rather, these relative confidence thresholds are built and continuously updated by the system during inspection or processing of the parts or ROIs.

FIG. 1 is a diagram of one embodiment of an automated visual inspection station, indicated generally at 160, that can incorporate the image recognition software 10 to detect and classify defects in printed wiring assembly according to the present invention. Exemplary station 160 includes a platform 162 and vibration isolated subplatform cradle 163 constructed from metal components to provide physical support for station 160. A pair of guides 164 are mounted on subplatform 163 and provide a path for populated printed wiring assemblies 166. A stop 168 can be used to stop each assembly 166 at the appropriate position for inspection, and a thumper 169 can be used to position assembly 166 against one of guides 164. Guides 164, stop 168 and thumper 169 form a material handling system for assemblies 166. In the FIG. 5 embodiment, the material handling system is 18 inches wide by one meter long with a two speed, reversible conveyor to handle assemblies 166 and has an industry-standard SMEMA interface built into platform 162 for interfacing with other components of a manufacturing line.

Station 160 further includes a light source 170 which provides light for illuminating assemblies 166 under inspection. Light source 170 can include any number of light sources, including a FOSTEC DC regulated 150 watt source with analog control and long life quartz Halogen bulbs (DDL type). Station 160 also includes a camera 172 that receives an image through an optic 174. Camera 172 can be a DALSA CL-E2 2048A TDI line scan camera with a VISION 1 PS1 linear power supply for CL-E2. Optic 174 can be an INVARITAR telecentric optic with 0.37× magnification over a 72 millimeter field of view (FOV). As shown, the light generated by light source 170 is split to two heads 176 through a bifurcated optical fiber 178. The heads 176 can be FOSTEC 6 inch line heads with cylindrical lenses. Light source 170, camera 172, optic 174, heads 176 and optical fiber 178 together form an imaging system for scanning and acquiring images of assembly 166. Because of the structured directed light provided by heads 176, three-dimensional spatial information can be extracted/computed from the intensity of the reflected light during scans.

Station 160 has a precision positioning system associated with the imaging system. The precision positioning system includes a threaded precision guide 180 having a motor 182 and a threaded precision guide 184 having a motor 186. (In other implementations, guides 184 and 186 could be, for example, pneumatic, hydraulic or magnetic.) Motors 182 and 186 include motor drive units which can be simultaneously controlled by a two-axis controller in interface devices 188. These components allow the imaging system to be moved across assembly 166 to scan in an image of assembly 166. The threaded precision guides 180 and 184 can be DAEDAL 406 series linear stages (e.g., 16 and 20 inch) with precision linear encoders and two pitch lead screws. Motors 182 and 186 can be two ZETA motor drives (one per axis) controlled by COMPUMOTOR 6200 Series Two axis indexers.

Interface devices 188, which include optical relays for digital control signals and digital/analog converters for analog control signals, interface between a computer system 190 and the various controlled components. Computer system 190 provides a processing and control engine for operating inspection station 160. Computer system 190 receives status information and provides control signals as well as communicating with peripherals 192. Computer system 190 can be an Industrial Computer Source rack mounted chassis having a single board computer with an INTEL PENTIUM PRO 200–450 MHz (or higher) processor and other typical computer components. Interface devices 188 can include a 6200 indexer interfacing through a standard RS232 serial port and computer boards and digital-to-analog and OPTO 22 interface cards.

Camera 172 can be controlled by a data I/O card in computer 190, and light source 170 can be controlled by multi-functional I/O PWB with a dual D/A upgrade. Specifically, the data I/O card can be a MATROX INTERNATIONAL camera interface card (RS 422). An associated processing accelerator card (described above) can be a MATROX INTERNATIONAL GENESIS 64/8 and MATROX INTERNATIONAL GPRO 16/8 processing card set that communicates via a high-speed backplane. With a MATROX INTERNATIONAL GENESIS card, additional MATROX INTERNATIONAL GPRO cards can be added up to 6 total to increase the processing capacity. Peripherals 192 can include a 17 inch color monitor, standard keyboard and mouse/trackball, and a 4 Gbyte DAT tape drive. The network interface of computer system 190 (not shown in FIG. 1) can be a 100 Mbit (100 BASE T) Ethernet card.

It should be understood that the image recognition software 10 of the present invention can be used with a variety of image producing mechanisms in addition to a camera. For example, the image recognition software 10 could be used in conjunction with images produced from infrared, x-ray systems, casoes, 3-D sensor maps, or other imaging devices. It should also be understood that the object imaged by the present invention can include any object that, when imaged, produces discernible features.

Figure 2:
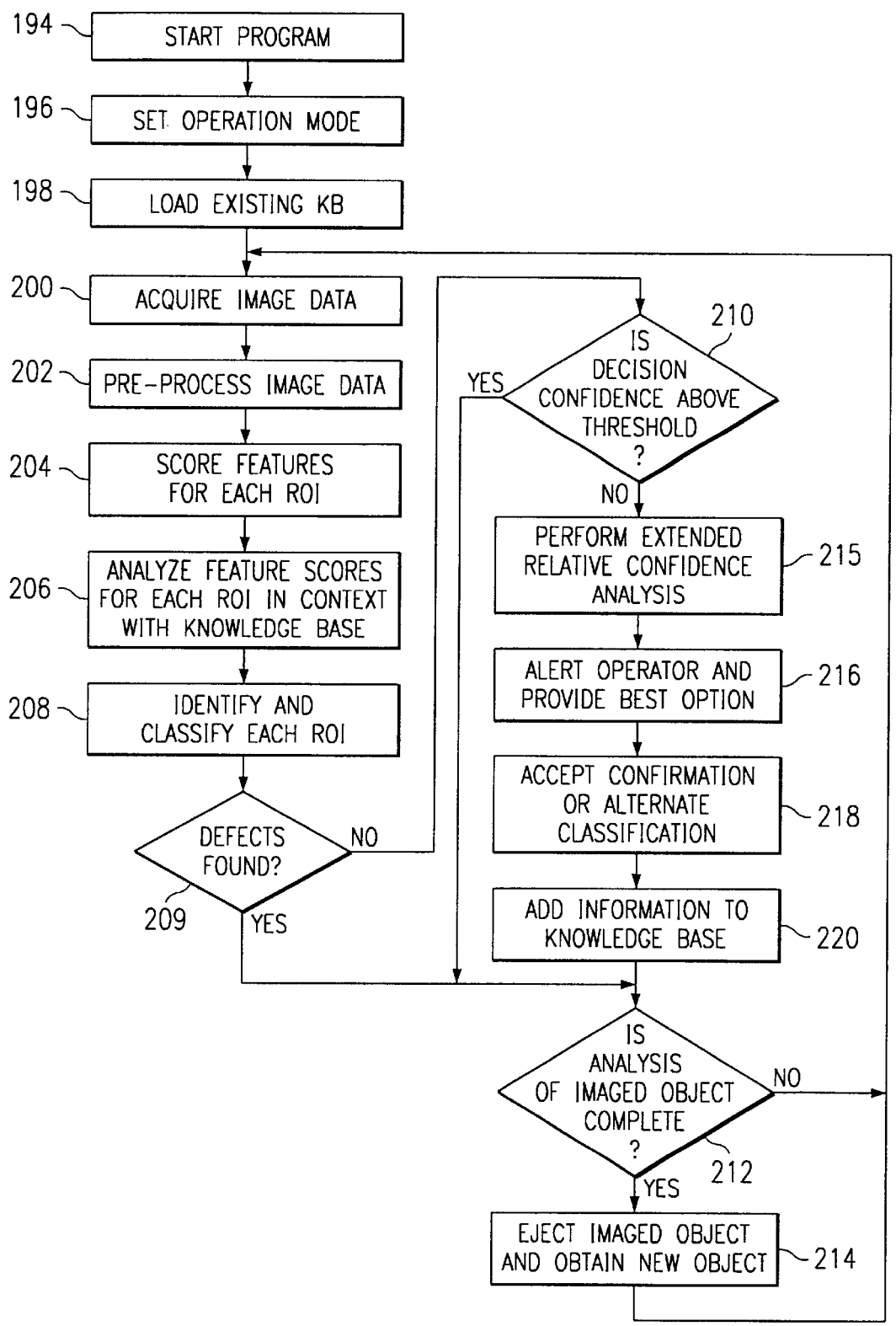
FIG. 2 is a flow chart of one embodiment of an image classification process of the present invention.

FIG. 2 is a flow chart of one embodiment of an automated inspection process implementing the image recognition software 10 of the present invention. As shown, at step 194, the image recognition software program 10 is initiated, the operation mode is set at step 196, and the existing knowledge base (from either prior imaged objects or from training as described in FIG. 2) is loaded at step 198. At step 200, the station acquires image data from scanning the object being inspected. The image data from the object is then preprocessed in step 202. After preprocessing the image data, the image is described by selected features in step 204. The features are then analyzed, in step 206, such that the ROI is analyzed in context with the system knowledge base. In step 208, defects in ROIs are identified and classified.

In step 210, the image recognition software determines whether the relative confidence in the classification is above a preset threshold. If so, the station checks, in step 212, whether analysis of the object is complete. If the analysis is complete, the process continues at step 214 with the ejection of the imaged object from the inspection station and obtaining a new object to inspect.

If, in step 210, confidence was not above the threshold, then the process continues at step 215. The image recognition software then performs an analysis to determine whether the extended relative confidence for the classification is above a preset threshold. In step 216, the operator is alerted and provided with the station's best option as to the proper classification. In step 218, the station accepts confirmation of the best option by the operator or accepts an alternate classification by the operator. Then, in step 220, the station adds information to the knowledge base as necessary to accomplish incremental learning based upon the operator's input. The process then continues at step 212 as discussed above.

Figure 3:
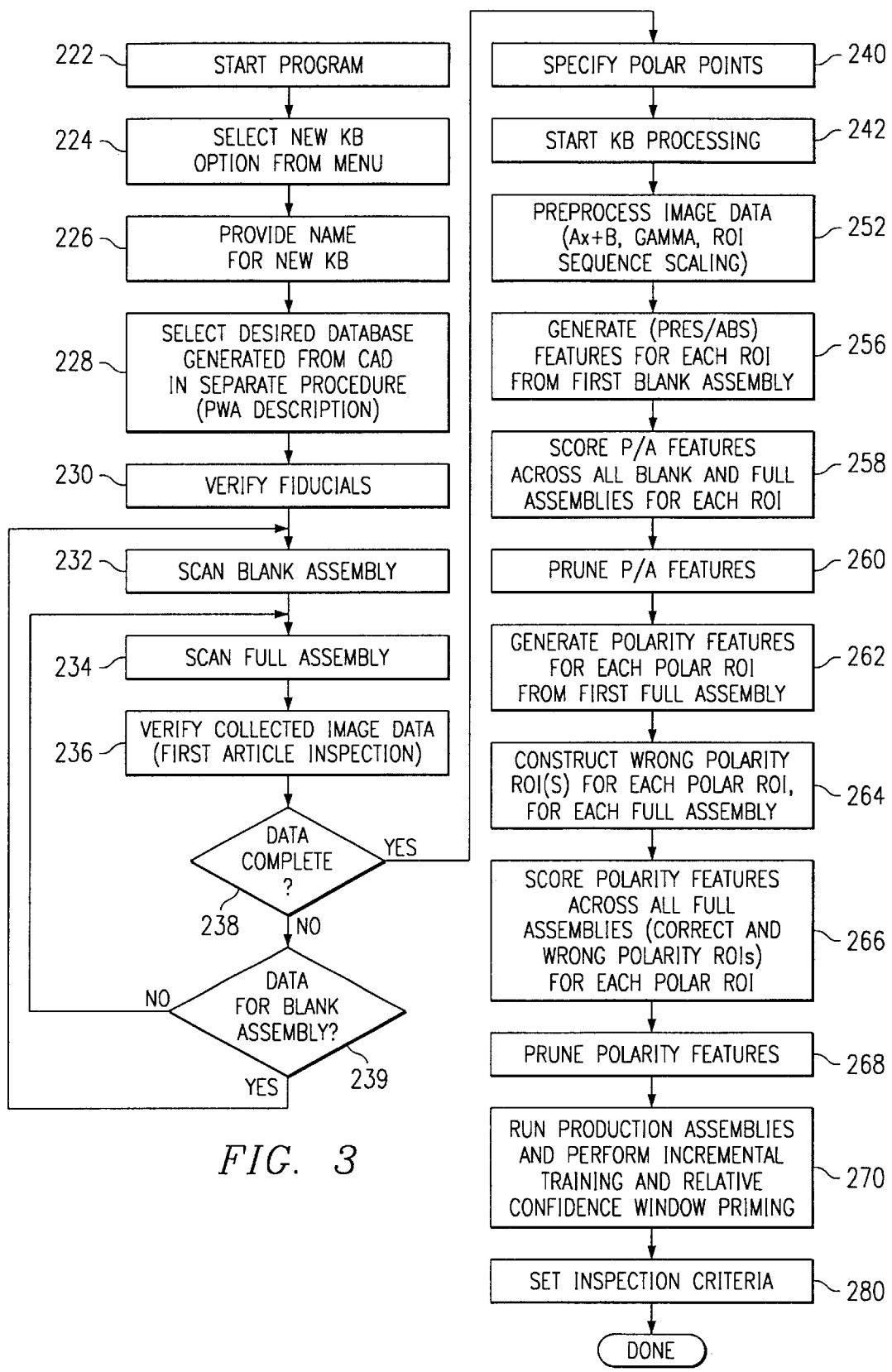
FIG. 3 is a flow chart of one embodiment of the training that is performed by the image recognition software of the present invention.

FIG. 3 is a flow chart illustrating the training performed by the image recognition software 10 of the present invention that is used to build the knowledge base that is loaded in FIG. 2. The training of FIG. 3 is done on new objects (e.g., printed wiring assemblies) that have not been previously imaged to build the initial knowledge base that is used later to make classification determinations. The image recognition program 10 is initiated at step 222 and the "create new knowledge base" option is selected and named by an operator (using, for example, a graphical user interface) at steps 224 and 226. A computer-aided design (CAD) database is selected that describes the regions of interest for the object to be imaged in order to train the image recognition software 10 at step 228 and the fiducials are verified at step 230. An image of one or more blank assemblies (i.e., no components installed) is collected at step 232, an image of one or more assembled assemblies is collected at step 234, and the image data from the blank and assembled images are verified at step 236. Data collection is complete when at least one blank and one assembled PWA have been processed. If the data collection is not complete, more images are collected at steps 232 and 234. If the data collection is complete, the process moves to step 240 to specify which parts on the PWA have polarity. The image recognition software now starts the new knowledge base creation at step 242. At step 252 the image data is preprocessed, then features are generated for each region of interest for the first blank assembly at step 256. At step 258, the presence/absence features across all blank and assembled assemblies previously imaged are scored, then the presence/absence features are pruned at step 260. At step 260, the presence absence features are pruned to provide the "optimal" features. Polarity features are then generated for each polarity region of interest from the first assembled assembly at step 262, then the wrong polarity images are constructed for each polarity region of interest at step 264. The polarity features are then scored across all assembled assemblies (both correct and constructed wrong polarity images) for each polarity region of interest at step 266. At step 268, these polarity features are pruned to provide the "best" polarity features. At this point, the image recognition software has generated the best (i.e., pruned) features for both presence/absence and polarity from which to make the presence/absence and polarity decision confidence analyses. At step 270, multiple assemblies are imaged to perform incremental training and relative confidence window creation. Based on these previous steps, inspection criteria can be set at step 280.

Many of the steps described in FIGS. 1–3 will be more fully described herein. Furthermore, the implementations of FIGS. 1–3 described herein are not intended to limit the scope of the present invention. For example, in addition to populated printed wiring boards, the present invention is applicable to analysis of bare printed wiring boards, semiconductor packages (e.g., PPGAS, PBGAS, C4 packages, or TAB tape) and other types of objects. Also, in contrast with the described implementation, the imaging system can be fixed while the object to be analyzed is moved. This approach would allow the imaging system to remain more stable during scanning which would allow more precise motion for ultra high resolution images (e.g., ~3μm pixels vs. 30 μm pixels), but would likely require a larger platform with a wider range of movement.

Figure 4:
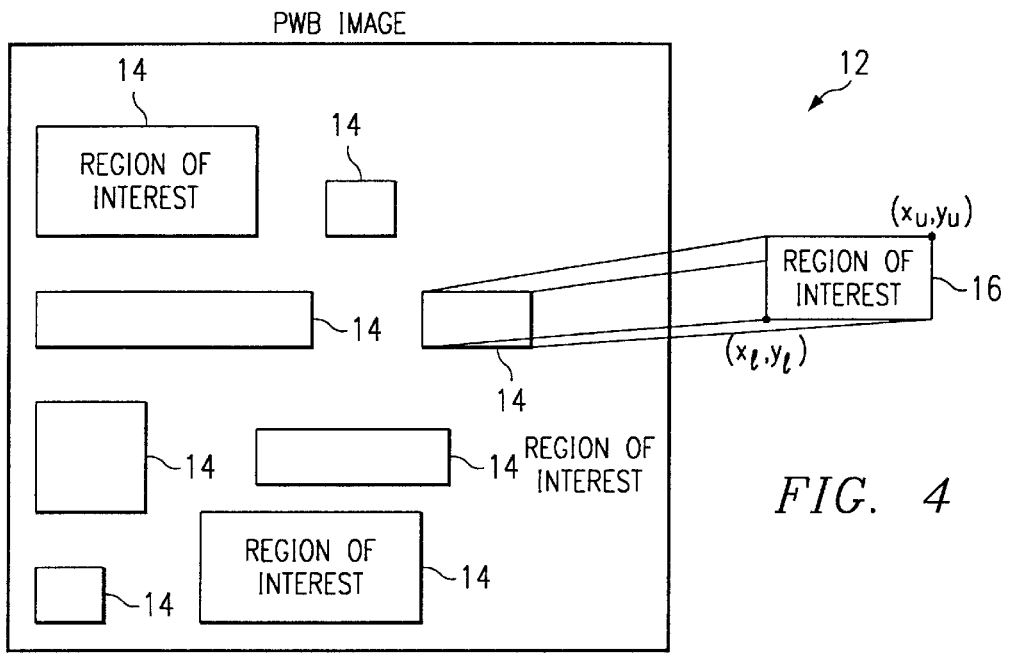
FIG. 4 shows a raw object image including a number of regions of interest.

FIG. 4 shows a typical raw object image 12 taken by a camera having a number of regions of interest 14 (ROI). For the particular application of visual inspection of a PWA, the image 12 is the image of a PWA and the ROIs 14 subimages 14 that include a component within the ROI 14. For the specific application of determining the presence/absence of a component, the regions of interest are preferably chosen to include discreet components. The definition of the ROIs to include discreet components can be initially provided to the dynamic image recognition software programming 10 of the present invention in a computer-aided design (or CAD) data file, where the CAD data file contains a computer generated version of the location and orientation of the ROIs on the object (i.e., the components on the PWA). Each ROI 14 has a horizontal and vertical upper position $(x_u, y_u)$ and a horizontal and vertical lower position $(x_l, y_l)$. The ROIs 14 are subimages that are sent to processors to parallelize each image 12 down to the component part.

Figure 5:
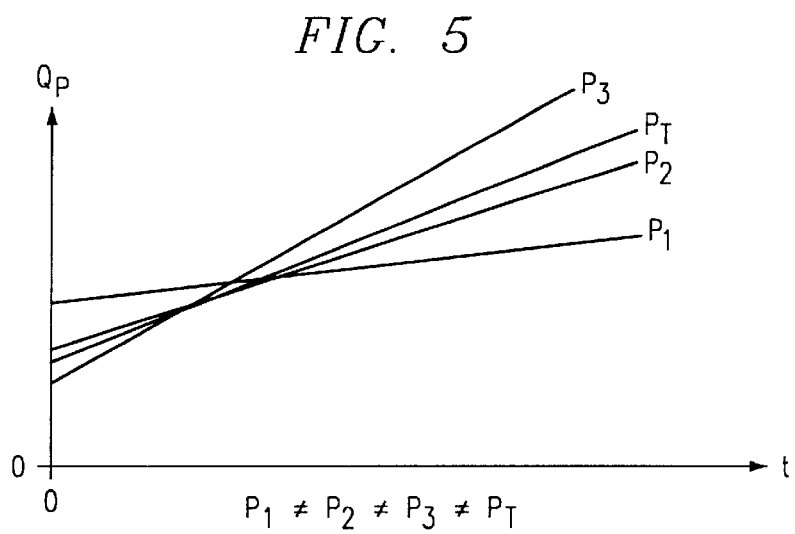
FIG. 5 shows a graph of light intensity versus time to illustrate gain and offset correction on an image.

FIG. 5 shows a graphical representation of time versus accumulated charge for an image 12 taken to illustrate typical gain and offset correction for an image 12 that can be performed using a visual inspection system of the present invention. The longer light of a given and fixed intensity is provided to an object, the more charge is integrated onto a pixel inside the camera. Pixel intensity is shown for three pixels ($P_1$, $P_2$, and $P_3$) of non-equal intensity. Pixel intensity is typically linear over time (i.e., as time increases, the charge increases linearly). A potential problem arises because each pixel is a different semiconductor having a different gain and offset. However, since each is typically linear in nature, a prototypical line $P_T$ can be defined or chosen and secondary gain and offset can be calculated so that every pixel maps to the prototypical line $P_T$. In other words, even though $P_1$, $P_2$, and $P_3$ are not equal to start with, after applying the appropriate a and b coefficients, $P_1'$, $P_2'$, and $P_3'$ are all equal to $P_T$. Thus, the differences between the lines normalize out to provide prime (or integrated) lines that are equivalent to $P_T$. After the gain and offset correction has been applied, every pixel will look like the prototypical pixel (at $P_T$) so that when light is illuminated for a particular time (t), the intensity value (Q) will be the same at every pixel. This is important to reduce the irregularities between pixels. For example, suppose there are 255 gray levels, differences of five to eight or more gray levels can exist between adjacent pixels, which can be significant noise. This noise can be eliminated for every pixel generated from the camera (through the appropriate gain and offset correction) so that within a defined gray level range, all the pixels will have the same value for any unique time interval. This pre-processing can be built into the camera used to take the image.

Figures 6, 7:
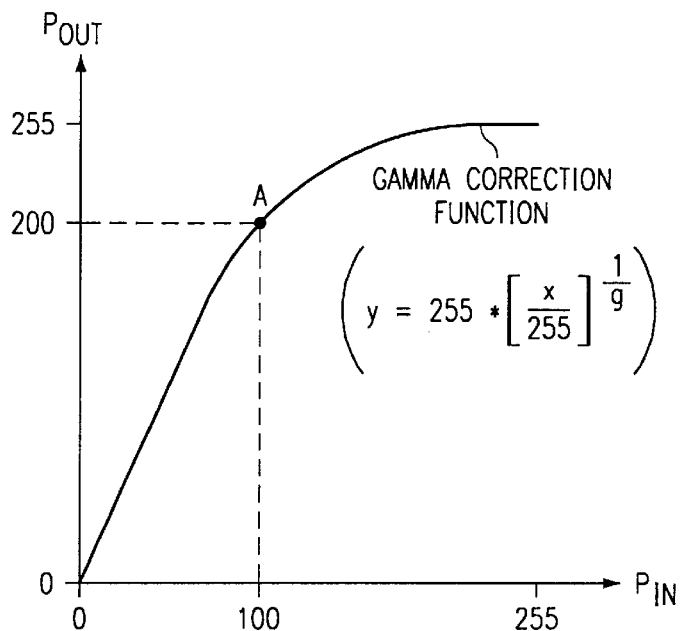
FIG. 6 is a graph of pixel input versus pixel output to illustrate gamma correction on an image.
FIG. 7 shows an example eight bit gray scale image of ten by ten pixels with the pixel intensity for each of the one hundred pixels.

FIG. 6 shows an graphical representation of a gamma correction or contrast enhancement performed using the inspection system of the present invention. Specifically, the present invention can perform a low light level contrast enhancement at the expense of items with brighter light levels. Typically, the better image content for images of PWAs for making component level determinations is contained in the lower light levels of the PWAs. The purpose of the gamma correction is to enhance low light levels. Therefore, in the darker areas from zero to a predetermined level, a steep gain is factored, while after the predetermined level a more shallow gain is factored. The gamma correction employed by the present invention can be a continuous function defined by:

$$y = 255 * [x/255]^{1/g} \tag{1}$$

where typical values include x=[0,255], y=[0,255] and in one embodiment gamma or g=2 (note that for a gamma=1, the above function has no effect). Gamma values in the range of two to three will appropriately enhance the low light level areas. To illustrate, at point A on the graph of FIG. 6, the light intensity input ($P_{IN}$) is 100 (on a 0 to 255 gray level scale), while the light output (after applying the gamma correction function is 200 ($P_{OUT}$). An alternative to the function described above would be a piecewise or superposition linear function, rather than the exponential function described in FIG. 6. In a two-segment, piecewise linear function, the first linear function can be changed without affecting the second linear function.

FIG. 7 shows an exemplary raw eight bit gray level image 12 that is ten by ten pixels. FIG. 7 will be further manipulated as shown in the following figures. The raw pixel gray level image 12 will also be referred to as the "mag0", or zero order magnitude space, and each pixel will be referred to with a "P (i,j)" where i and j represent a location on the image defined as shown in FIG. 7 (i the vertical and j the horizontal position beginning with a 0,0 position at the upper left hand corner). As a ten by ten pixel image, image 12 contains one hundred pixel values 18. Each pixel value 18 ranges between zero and 255, with zero representing the darkest value, or black, and 255 represents the lightest value, or white. For example, pixel P(0,0) has a gray scale value of 40. The image recognition software 10 of the present invention will manipulate the pixel values 18 to make the determinations of which ROIs contain present components and whether the components in the ROI have the proper polarity.

Figure 8:
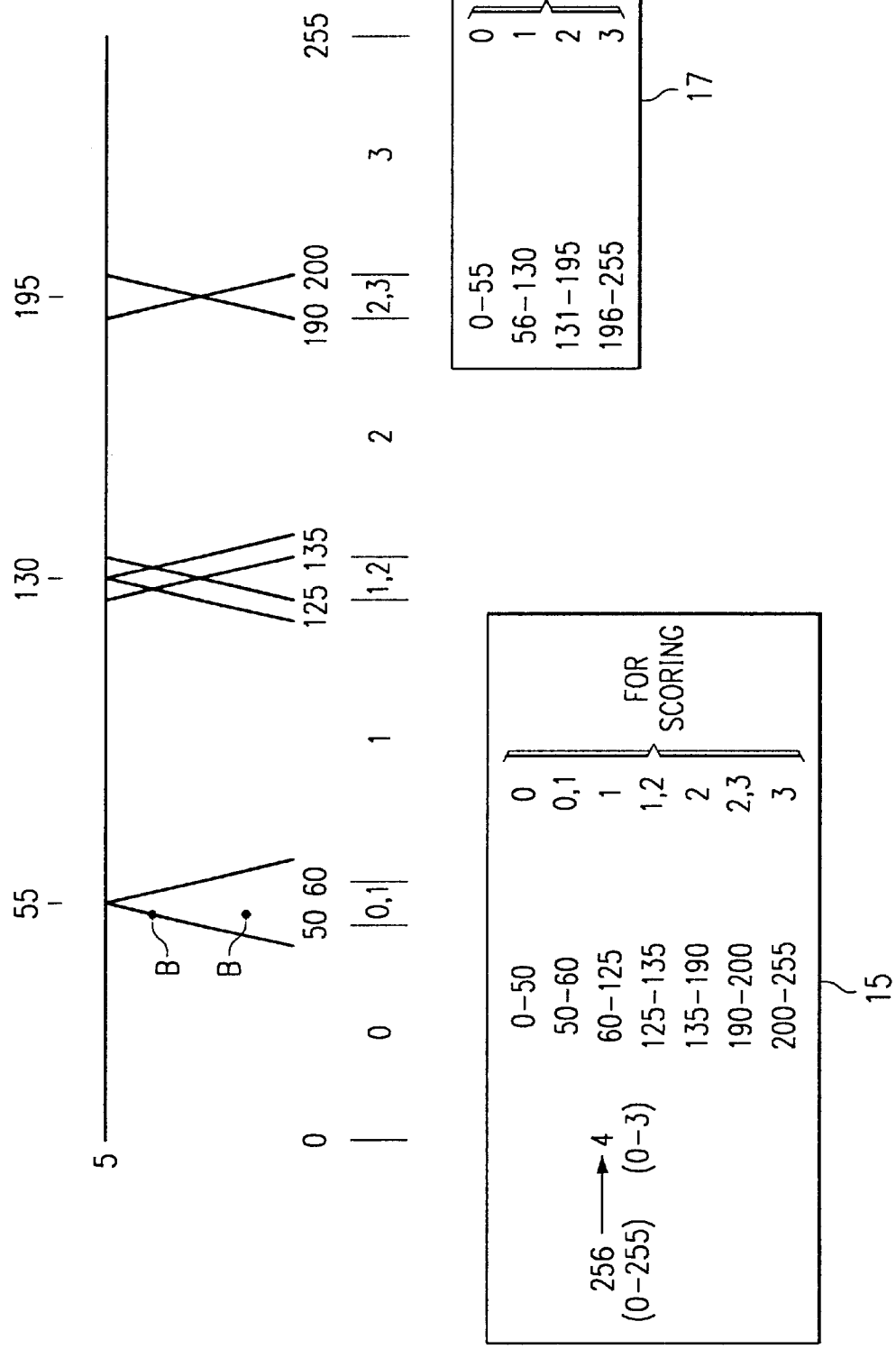
FIG. 8 illustrates a gray scale reduction methodology that can be performed on gray scale images.

FIGS. 8 and 9 show a gray scale reduction methodology and result for the image 12 of FIG. 7 using an exemplary reduction using a 256 to a 4 gray scale transform 19 (i.e., from 0–255 to 0–3). Note that the reduction transform can be, and is in alternative embodiments, a higher number (e.g., a reduction from 0,255 to 0,7). In a preferred embodiment, the gray scale reduction is from 256 gray levels to 12 codes. FIGS. 8 and 9 shows a reduction from 256 gray levels to 4 codes to simplify the algorithms for the purposes of illustration. In FIGS. 8 and 9, gray scales from 0–55 are given a code value of 0, gray scales from 56–130 are given a code value 1, gray scales from 131–195 are given a code value 2, and from 196 to 255 are given a code value 3. According to reduction map 17, the reduction map 17 is used to cluster the pixels.

FIG. 8 also illustrates the overlapping of certain pixel values within certain ranges when scoring the pixels. Reduction map 15 is used to score the pixels from an imaged object. Thus, as a pixel value nears a change over code point (e.g., from a 0 to a 1 value), the image recognition software programming 10 of the present invention can perform a ramping to give the pixel a relative code value. For example, any pixels with gray scale values between 50 and 60 in the ramp of FIG. 8 will have a partial zero code value and a partial 1 code value defined by the ramp. As shown in FIG. 8, the ramp is from zero to five across a ten pixel horizontal range. Thus, any pixels having gray scales between zero and fifty (and 60–125, 135–190, and 200–255) will fall on the "5" value, while pixels between 50 and 60 will have components of both a zero code value and a one code value. For example, the point labeled B is a 52 gray level raw image value. This translates to 80% code zero reduced gray scale value and a 20% code one reduced gray scale value. The ramp down allows all pixels to be represented by a reduced gray scale code value. The stepped reduction map 17 is used for clustering because, for a cluster, a pixel must be in one cluster or another. Thus, there are distinct boundaries between groups of pixels. In contrast, the ramped reduction map 15 is used for scoring to allow for a gradual class change, for a more graceful degradation or transition between groups.

The result of performing the FIG. 8 methodology on the raw pixel image 12 of FIG. 7 is shown in FIG. 9. FIG. 9 shows a 256→4 gray scale reduction image 20 for the image 12 of FIG. 7 using the 256 to N reduction transform described by FIG. 8. The gray scale reduction image 20 of FIG. 9 is also referred to as the "reduced mago space", or the reduced zero order magnitude space 20. To illustrate, the reduced P (0,0) value of FIG. 9 is a "0" according to the grayscale reduction transform 19 because the P(0,0) value of FIG. 7 is "40" which is between 0 and 55. The remaining reduced P(i,j) values of FIG. 9 are determined similarly. The raw image 12 has now been reduced to reduced zero magnitude image 20 so that clustering can be performed as will be described more fully. The image recognition software 10 performs a histogram of the reduced zero order magnitude space to determine the number of zero order reduced magnitude color code classes required in order to produce the zero color reduction map. The image recognition software program 10 contains the gray-scale or color reduction methodology or algorithm described in FIG. 8 and creates the reduced mago space 20 by running the color reduction algorithm on the raw image 12 of FIG. 9.

Figure 10:
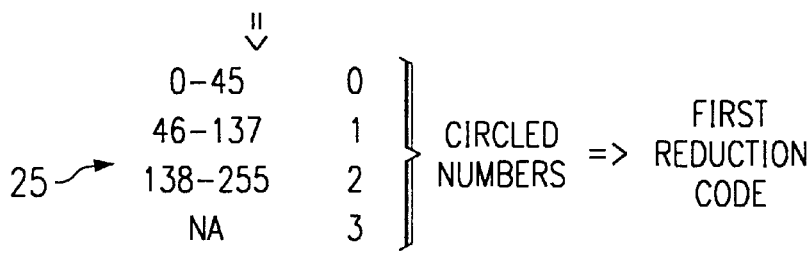
FIG. 10 is the first order derivative magnitude image and the reduced first order derivative magnitude image as derived from the image of FIG. 7.

FIG. 10 shows both first order magnitude derivative image 22 and first order magnitude reduced image 30 (circled values) (referred to herein as the "mag1" or "first order magnitude space" and the "reduced mag1" or "reduced first order magnitude space", respectively) of the raw gray scale image 12 of FIG. 7. FIG. 10 is derived from FIG. 7 using image recognition software program 10 as follows. The first order magnitude reduction values 21 (or P'(i,j)) at each point of the first order magnitude space 22 of FIG. 10 are determined as the maximum positive difference between the raw pixel gray level value at that point in FIG. 7 and each of the nine immediately adjacent pixel gray level values of FIG. 7. The collection of these P'(i,j) 21 values represents the first order magnitude space 22. For example, the first order magnitude value 21 for the P'(0,0) point (upper left hand corner of the first order magnitude space 22) is "1" because the gray level value for P(0,0) of FIG. 7 is 40 and the maximum positive difference between P(0,0) of FIG. 7 and each of the gray level values 18 surrounding P(0,0) is the difference between P(0,0) and P(1,0) (or 40−39=1). To further illustrate, P'(0,6)=130 for FIG. 10 because in FIG. 7, P(0,6)=175 and the smallest of its eight surrounding pixels in FIG. 7 is P(0,5)=45. If all of the adjacent pixels have higher gray level values 18 in FIG. 7, the corresponding P' point in FIG. 10 is assigned a first order magnitude value of "0" (see P'(4,9)). The first order magnitude values 21 can be determined according to the formula:

$$P'(i,j) = \text{MAX } \{P_{i,j} - P_{k,1}\} \qquad (2)$$

where k=(i, i+1, i−1) and l=(j, j+1, j−1). It should be understood that the second order magnitude values could also be determined in the converse (use the lowest differential). The first order magnitude space 22 can be similarly determined from any raw pixel gray level image 12.

The second step in FIG. 10 is to color reduce the first order magnitude space 22 to obtain the reduced first order magnitude space 30, which is illustrated by the circled numbers 23 in FIG. 10. The image recognition software program 10 again initiates the color reduction subroutine to produce the reduce magi space 30 of FIG. 10 according to a first order reduction map. On a raw gray level value scale from 0 to 255, the magnitude reduction values 21 can also range from 0 to 255. For the example of FIG. 10, a first order reduction map 25 is used where first order magnitude values of 0–45 are given a first order reduced magnitude color code of 0, first order magnitude values of 46–137 are given a first order reduced magnitude color code of 1, and first order magnitude values of 138–255 are given first order reduced magnitude color code of 2. The image recognition software 10 performs a histogram of the first order magnitude space to determine the break points of the first order reduced magnitude color codes. The image recognition software 10 will limit the number of first order reduced magnitude color codes in order to reduce complexity while maintaining enough color code classes to provide a distinction between groups of magnitude reduction values. An example of this is provided in *Color Image Quantization for Frame Buffer Display*; COMPUTER GRAPHICS, Vol. 16, No. 3, pp. 297–305, July 1982.

FIG. 11 shows a first order direction derivative image 40, referred to herein as the "dir1" or the "first order direction space," of the raw gray scale image 12 of FIG. 7. FIG. 11, like FIG. 10, is also derived from FIG. 7 using the image recognition software 10. The first order direction code values 28 for any particular location in the first order direction space 40 is determined based on the direction code map 26. As shown in FIG. 11, direction code map 26 has nine code values from 0 to 8 to indicate the direction from the P(i,j) location on FIG. 7 to the lowest, immediately adjacent P (i±1,j±1) value. For example, if the lowest value of the pixels surrounding a particular pixel in FIG. 7 is located directly above that particular pixel, the direction code will be a "2" according to direction code map 26. It should be understood that the numbering of the direction code map 26 can vary and the particular ordering of the numbers does not matter, though in the preferred embodiment, the direction code map 26 will contain nine distinct numbers which are preferably integers to reduce computing complexity.

The image recognition software 10 determines the first order direction code values 28 (FIRST DIRECTION CODE (i,j)) at each point on the first order direction space 40 by calculating the direction from that point on FIG. 7 to the lowest value raw pixel gray level value 18 of its eight immediately adjacent raw pixel gray level values 18 based on the raw pixel gray level values from FIG. 7. In other words, the direction code will lie at the same position that was used to determine the first order P'(i,j) 21 values of FIG. 10. For example, FIRST DIRECTION CODE (0,0) (i.e., first order direction code at point 0,0) is determined by looking at P(0,0) of FIG. 7 and determining which of its surrounding raw image pixels has the lowest gray level value (just as was done to determine the magnitude space of FIG. 10). Since the lowest gray level value surrounding P(0,0) occurs at P(1,0) which is directly below P(0,0), the FIRST DIRECTION CODE (0,0) is "7" according to the direction code map 26. To further illustrate, FIRST DIRECTION CODE (0,6)=4 due to the fact that the lowest raw pixel gray level 18 surrounding P(0,6) is located at P(0,5) which is in direction code "4" (or directly adjacent to the left) according to direction code map 26. If none of the pixels (i.e., P(i,j) values) surrounding the pixel of interest in FIG. 7 have a lower gray level value than the pixel of interest, the first order direction code 28 is entered as a "0" which signifies that no surrounding pixel had a lower level value (for example, FIRST DIRECTION CODE (4,9) is a "0" because none of pixels immediately adjacent to P (4,9) have lower gray level values than P(4,9)). Furthermore, if two or more immediately adjacent pixels have an equal, yet lowest value, the first order direction code 28 will be the lowest available direction code based on the direction code map 26 (for example, FIRST DIRECTION CODE (1,1) is a "4" rather than a "6", even though both P(1,0) and P(2,0) have a equal lowest P value of "39", because 4 is less than 6). It should be understood that the rule of choosing the lower direction code value for equally low P values is arbitrary and the highest direction code value (or even an arbitrary code value) could also have been chosen. While either mode is equally acceptable, a consistent selection throughout is preferable. All of the FIRST DIRECTION CODEs of the dir1 or first order direction space 40 are determined similarly, as illustrated in FIG. 11.

Figure 12:
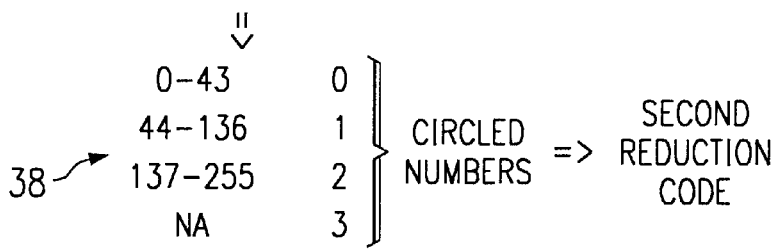
FIG. 12 is the second order derivative magnitude image and the reduced second order derivative magnitude image as derived from the image of FIG. 10.
Figures 13, 14:
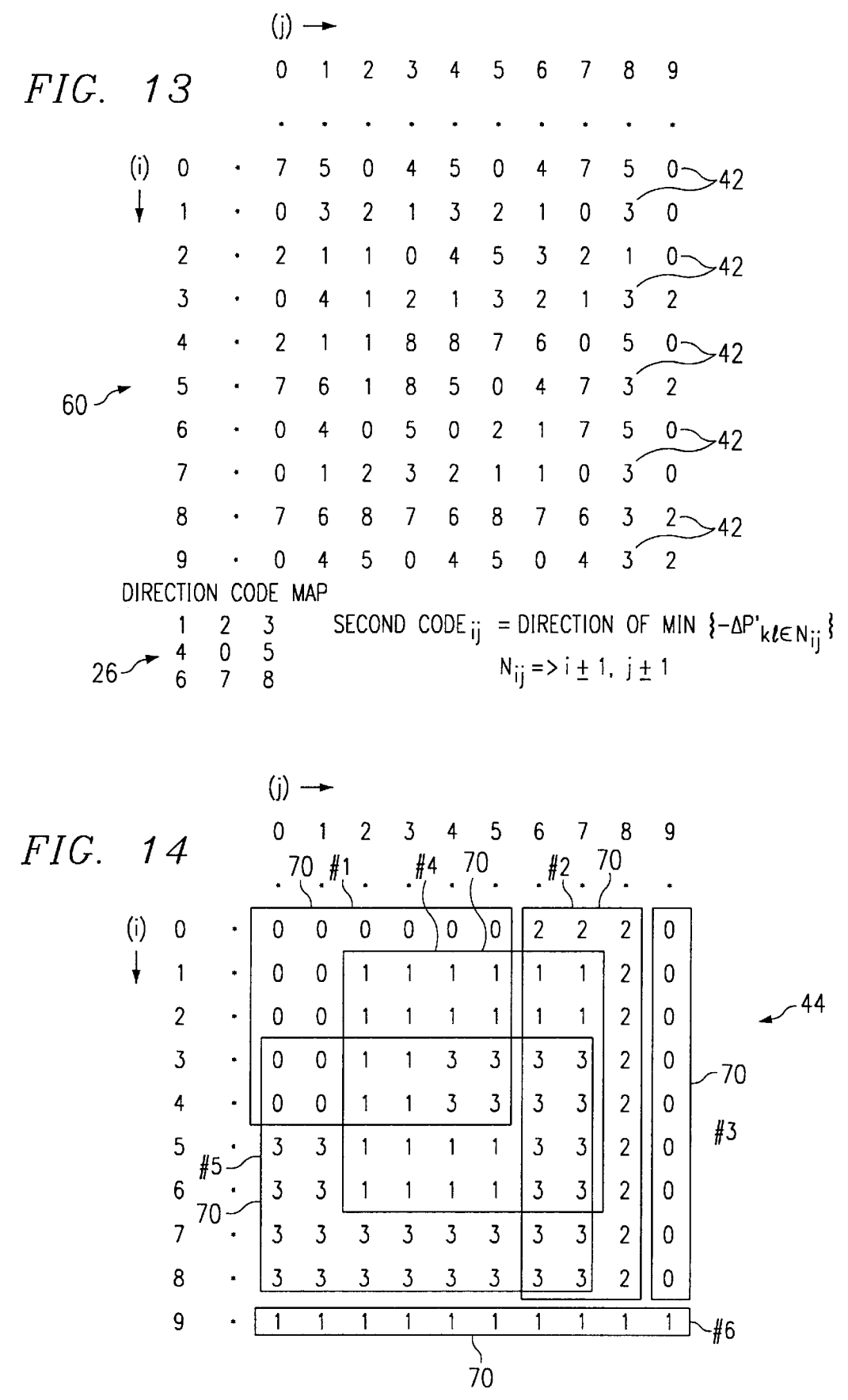

FIGS. 12 and 13 are derived from the FIG. 10 first order magnitude space 22 in the same manner that FIGS. 10 and 11 were derived from the zero order magnitude space 12 of FIG. 7 using image recognition software 10. FIG. 12 shows both the second order magnitude derivative image 32 and second order magnitude reduced image 50 (circled values) (referred to herein as the "mag2" or "second order magnitude space", and the "reduced mag2" or "reduced second order magnitude space", respectively) of the first order magnitude space 22 of FIG. 10. The second order magnitude reduction values 34 (or P"(i,j)) at each point of the second order magnitude space 32 of FIG. 10 are determined as the maximum positive difference between the first order magnitude values 21 at that point in FIG. 10 and each of its eight immediately adjacent first order magnitude values 21. The collection of these P"(i,j) 34 values represents the second order magnitude space 32. As an example, the second order magnitude value 34 for the P"(0,0) point (upper left hand corner of the second order magnitude space 32) is "1" based on 1−0=1 because the value for P'(0,0) of FIG. 10 is "1" and the lowest P' around P'(0,0) is a "0" value at P'(1,0). To further illustrate, P"(9,9)=26 because in FIG. 10, P' (9,9)=27 and the smallest of its eight surrounding P' values in FIG. 10 is P'(8,9)=1. Once again, if all of the adjacent P' values in FIG. 10 are equal to or higher than the P' of interest, the P' value in FIG. 12 is assigned a second order magnitude value of "0" (see P'(4,9)). The second order magnitude values 34 can be determined according to the formula:

$$P''(i,j) = \text{MAX}(P'_{i,j} - P'_{k,l}) \quad (3)$$

where k=(i, i+1, i−1) and l=(j, j+1, j−1). It should be understood that the second order magnitude values can be determined in the converse (use the lowest differential). The second order magnitude space 32 can be similarly determined from any first order magnitude space 22.

The reduced second order magnitude space (or "reduced mag2"), represented by the circled numerals in FIG. 12, is created by color reducing the second order magnitude space 32. For FIG. 12, a second order reduction map 38 is used such that second order magnitude values of 0–43 are given a second order reduced magnitude color code of 0, second order magnitude values of 44–136 are given a second order reduced magnitude color code of 1, and second order magnitude values of 137–255 are given a second order reduced magnitude color code of 2. In order to obtain the second order reduction map 38, the image recognition software 10 creates a histogram of the second order magnitude space 32 to determine the number of break points for the second order reduced magnitude color codes, similarly to that described in creating the first order reduction map 25.

FIG. 13 shows a second order direction derivative image 60, referred to herein as the "dir2" or the "second order direction space," of the first order magnitude space 32 of FIG. 10. The second order direction code values 42 for any particular location in the second order direction space 60 is once again determined based on the direction code map 26. The second order direction code values 42 (SECOND DIRECTION CODE(i,j)) at each point on the second order direction space 60 are determined as the direction from that corresponding (i,j) position on FIG. 10 to the lowest value first order magnitude value 21 (or P') of its eight immediately adjacent P' values 21. In other words, the direction code will lie at the same position that was used to determine the P"(i,j) of FIG. 12. For example, SECOND DIRECTION CODE (0,0) (i.e., second order direction code at point (0,0) of FIG. 13 is determined by looking at P'(0,0) of FIG. 10 and determining which of its surrounding raw image pixels has the lowest gray level value (just as was done to determine the second order magnitude space of FIG. 12). Since the lowest PI value surrounding P'(0,0) occurs at P'(1,0) which is directly below P'(0,0), the SECOND DIRECTION CODE (0,0) is "7" according to the direction code map 26. To further illustrate, P"(6,3)=5 due to the fact that the lowest P' value 21 surrounding P'(6,3) in FIG. 10 is located at P'(6,4) which is in direction code "5" (or directly adjacent to the right) according to direction code map 26. As in FIG. 11, if none of the surrounding P' values of FIG. 10 have a lower P' value than the P' of interest, the second order direction code 42 is entered as a "0" in FIG. 13 (see P"(4,9) of FIG. 13). Likewise, if two surrounding P' values are lowest and equal, the second order direction code 42 chosen will be the lower direction code from direction code map 26 (see P"(1,1) of FIG. 13). All of the SECOND DIRECTION CODEs (i,j) of the dir2 or second order direction space 60 are determined similarly, as illustrated at FIG. 13.

It should be understood that higher order derivatives of FIG. 7 (beyond the second order magnitude and direction derivatives) could be determined in a similar manner using the methodology described above and variations of that methodology. While some additional information can be obtained from the higher order derivatives, the present invention can be practiced successfully by using the second order derivatives described, and the additional complexity of accumulating and processing the higher order derivatives has not been found necessary to date.

The additional functions of the image recognition software program 10 of the present invention will be described using the five derived spaces described. The result of the manipulations of the raw pixel image 12 of FIG. 7 by the image recognition software 10 is to produce five independent spaces from the initial image 12: (1) the reduced zero order magnitude space 20 shown in FIG. 9 (reduced mag0); (2) the reduced first order magnitude space 30 shown in FIG. 10 (reduced magi); (3) the first order direction space 40 shown in FIG. 11 (dir1); (4) the reduced second order magnitude space 50 shown in FIG. 12 (reduced mag2); and (5) the second order direction space 60 shown in FIG. 13 (dir2). Image recognition software programming 10 can perform clustering and cluster reduction on these five spaces to generate "features" within the regions of interest in each space in order to determine the presence/absence and polarity of the ROIs in the raw image 12. The manner in which clustering and cluster reduction is performed on these five spaces is described in FIGS. 14–21.

FIGS. 14–21 illustrate the clustering and cluster reduction process for the reduced zero order magnitude space 20 of FIG. 9 using clustering and cluster reduction rules contained within image recognition program 10. The clustering can be performed similarly for each of the other four spaces. It should be understood that other clustering rules could be used for all five spaces, or even that different clustering rules could be used on each of the five spaces.

FIG. 14 shows an initial clustering result 44 created by image recognition program 10 by performing clustering on the reduced mago space 20 of FIG. 9 to create six bounding boxes 70. In the embodiment shown in FIG. 14, the initial bounding boxes 70 are created according to the following general rules:

1) at a defined starting point on FIG. 9, begin passing a three by three filter over the entire region of interest (ROI) where a three by three filter is the process of examining the eight closest neighbors to each pixel (this can be done according to a predetermined strategy; for example, a raster scanning methodology that begins at the upper left pixel in the image and travels horizontally until all pixels in the first row have been examined and then starts at the second row of pixels at the left-most pixel, and so on until all pixels have been examined);

2) filter each pixel according to the following rules:
   i) if pixel (i,j) has the same code as one or more of the eight neighboring pixels to pixel (i,j), assign pixel (i,j) the same cluster number as the matching neighboring pixel(s), [where the neighboring pixels for pixel (i,j)=at least pixels {(i−,j−1), (i−1,j), (i−1, j+1), and (i,j−1)} (these four neighbors are used out of the eight neighborhood for a raster scanning methodology for simplicity)];
   ii) if multiple neighboring pixels have matching codes and there is more than one cluster number assigned to these multiple matching neighboring pixels, assign pixel (i,j) the codes of all matching neighbors;
   iii) else, assign pixel (i,j) a unique cluster number;

3) for all pixels with multiple cluster numbers, choose one of the cluster numbers to define these pixels;

4) pass over the entire ROI a second time to convert all cluster numbers using the reduction map to reduce the space; and 5) define bounding boxes for each cluster that contain all of the points in the cluster.

These rules will be further elaborated upon in the description of FIG. 14. It should be understood that additional clustering mechanisms can be added to these within image recognition program 10 to additionally cluster codes. Furthermore, initiating clustering at particular defined points, such as a corner of the image, can reduce the complexity of the clustering algorithm as illustrated below and in FIG. 14.

FIG. 14 will illustrate the clustering of image recognition software 10 for the reduced mago space 20 of FIG. 9. The initial cluster #1 will begin at reduced P(0,0) of FIG. 9 which has a value of "0" and will continue both horizontally and vertically until a different reduction code is encountered to include all the "0" reduction codes. Thus, for cluster #1, the "0" reduction codes go horizontally until reduced P(0,6) which has a "2" code (thus cluster #1 will include reduced P(0,0) to reduced P(0,5) horizontally) and vertically down until reduced P(5,0) which has a "3" code (thus cluster number 1 will include reduced P(0,0) to reduced P(4,0) vertically). The same algorithm is now performed at reduced P(4,0) and reduced P(0,5) to determine if either horizontally or vertically, respectively, the "0" codes continue outside the area already bounded by reduced P(0,0), reduced P(0,5) and reduced P(4,0). Since horizontally from reduced P(4,0) the "0" codes only extend one more place (to reduced P(4,1) and since vertically from reduced P(0,5) the "0" codes do not extend at all, the bounding box remains the rectangle bounded by reduced P(0,0), reduced P(0,5), reduced P(4,0), and reduced (4,5). In this way, all adjacent code "0" values get clustered in cluster number 1 (along with some non-code "0" values).

At this point, the process is repeated for the two initially discovered new codes at P(0,6) which is a code "2" and P(5,0) which is a code "3". Cluster number 2 includes the code "2" values from reduced P(0,6) horizontally to reduced P(0,8) and down from reduced P(0,8) to reduce P(8,8) and is determined as described for cluster number 1. Cluster number 5 is formed starting at reduced P(5,0) and travels horizontally to reduced P(5,1) and vertically down to reduced P(8,0). From P(8,0) the box expands horizontally to the right to include through reduced P(8,7). From reduced P(8,7) the bounding box expands up vertically to include reduced P(3,7). Thus, bounding box 70 for cluster number 5 is defined at its corners by reduced P(3,0), reduced P(8,0), reduced P(8,7), and reduced P(3,7). Bounding boxes 70 for cluster number 3 and number 6 are formed similarly from starting points lying outside of cluster number 2 and number 5, respectively. At this point, every code of FIG. 9 is included in a bounding box 70.

Table 1 shows the results of the clustering performed in FIG. 14 and some additional calculations performed by the image recognition software 10. As shown in TABLE 1, feature number 1 is a bounding box 70 with a code "0" that is generated from cluster number 1 data (the codes used to generate the bounding box) that includes fourteen code "0" pixels and a bounding box area of thirty (i.e., 30 total pixels). Once a bounding box is placed around a cluster of pixels, that bounded cluster of pixels is a "feature." The image recognition software 10 calculates a feature number 1 raw density of code "0" pixels relative to the total number of pixels in the bounding box as 47% (i.e., 47% of the pixels in feature 1 are code "0" pixels); and then calculates a reduction raw density ratio, which is the reduced number of code "0" pixels divided by the initial number of code "0" pixels. The purpose of the reduction ratio is to track how much of the feature is eliminated due to shrinking rules as will be further described below. Similarly, feature number 5 is a code "3" feature having thirty-two code "5" pixels, forty-eight total pixels in the bounding box, and a raw density of 67%. The image recognition software 10 performs these calculations for all features formed (as shown in Table 1).

The image recognition software 10 now performs an analysis on the raw density for each cluster to determine whether any of the features meet a minimum raw density threshold. In one embodiment, if the raw density of a feature is less than 75%, then the image recognition software 10 will shrink or erode the bounding boxes 70 for that feature. Thus, for the clusters of FIG. 14 and Table 1, feature numbers 3 and 6 have raw densities in excess of 75% and thus will not be further manipulated or shrunk. Each of features 1, 2, 4 and 5 do not meet the minimum density threshold and will be shrunk. The image recognition software 10 will shrink the bounding boxes 70 to remove the "weakest" edge so that the outermost edge containing the fewest number of codes for that feature is eroded.

The image recognition software 10 can also perform another analysis on each feature by calculating an "edge ratio" for each edge of each feature and comparing these edge ratios to a minimum edge ratio threshold. The edge ratios for each feature is calculated by defining the outer horizontal row(s) and/or vertical column(s) of the bounding boxes 70 and dividing the number of codes for that feature contained in the edge by the total number of codes in that edge. In one embodiment, if any edge ratio is less than 25%, the image recognition software 10 will shrink the bounding box 70 by eroding the edge having the minimum edge ratio. It should be understood that the erosion of bounding boxes could be based on 1) density, 2) edge ratios or 3) both.

FIG. 15 contains clustering result 46 after image recognition software 10 performs a first iteration shrinking of features 1, 2, 4 and 5. In feature number 1, there are four edges that could potentially be removed: Edge 72 defined as reduced P(0,0) to reduced P(0,5) that contains six values, Edge 74 from reduced P(0,0) to reduced P(4,0), Edge 76 from reduced P(4,0) to reduced P(4,5), and Edge 78. Edges 72 and 74 both contain all code "0" and therefore represent very strong edges that would not be eroded. Edge 76 has six values, two of which are code "0" for an edge ratio of 2/6 or 33%. Edge 78 has five values, only one of which is a code "0" for an edge ratio of 1/5 or 20%. As the minimum edge ratio for feature number 1 occurs along edge 78, the image recognition software 10 shrinks bounding box 70 so that feature number 1 no longer includes edge 78. Note that if two or more edges on a feature have the same edge ratio, any one of the edges can be removed randomly or by some defined choosing mechanism. After the erosion process, feature number 1 is now bounded by reduced P(0,0), reduced P(4,0), reduced P(0,4), and reduced P(4,4), as shown in FIG. 15. Similar edge reductions to erode the weakest edge are performed by the image recognition software 10 on features 2, 4, and 5 as shown in FIG. 15.

The image recognition software 10 now performs additional calculations on the newly shrunken features 1, 2, 4 and 5 as shown in Table 2.

TABLE 1

| FEATURE NUMBER | CODE | NUMBER OF PIXELS OF CODE TYPE (# PIXELS) | BOUNDING BOX AREA (BB AREA) | RAW DENSITY $\left(\frac{\# PIXELS}{BB\ AREA}\right)$ | REDUCTION RATIO $\left(\frac{\# PIXELS}{\# PIXELS}\right)$ |
|---|---|---|---|---|---|
| 1 | 0 | 14 | 30 | 47% | |
| 2 | 2 | 11 | 27 | 41% | |
| 3 | 0 | 9 | 9 | 100% | 9/9 100% |
| 4 | 1 | 24 | 36 | 67% | |
| 5 | 3 | 32 | 48 | 67% | |
| 6 | 1 | 10 | 10 | 100% | 10/10 100% |

TABLE 2

| FEATURE NUMBER | CODE | REDUCED NUMBER OF PIXELS OF CODE TYPE (R PIXELS) | REDUCED BOUNDING BOX AREA (RBB AREA) | FIRST REDUCTION DENSITY $\left\{\dfrac{\text{R PIXELS}}{\text{RBB AREA}}\right\}$ | FIRST REDUCTION RATIO $\left\{\dfrac{\text{R PIXELS}}{\text{\# PIXELS}}\right\}$ |
|---|---|---|---|---|---|
| 1 | 0 | 13 | 25 | 52% | N/A |
| 2 | 2 | 10 | 18 | 56% | N/A |
| 3 | 0 | 9 | 9 | 100% | (100%) |
| 4 | 1 | 22 | 30 | 73% | N/A |
| 5 | 3 | 28 | 40 | 70% | N/A |
| 6 | 1 | 10 | 10 | 100% | (100%) |

Feature number 1 of Table 2 is a code "0" cluster that now contains thirteen code "0" pixels (one code "0" being lost due to the edge reduction) and twenty-five total pixels. The first reduction density is calculated by dividing the remaining number of code "0" pixels in the reduced feature number 1 by the reduced hounding box area for reduced feature number 1 (i.e., 13/25) to provide a first reduction density of 52%. A first reduction ratio can be calculated for feature number 1 by dividing the remaining number of code "0" pixels in the reduced bounding box (13) by the number of pixels in the original feature number 1 bounding box (14), for a first reduction ratio of approximately 93%. However, because the first reduction density for feature number 1 remains below the density threshold of 75%, an additional edge reduction must be performed on feature number 1. Therefore, the first reduction ratio need not be calculated because the reduction ratio is used after the minimum density threshold is met to determine if too much of the initial feature has been eroded (more fully described by FIGS. 16–18 and its accompanying text). As shown in FIG. 15, none of clusters 1, 2, 4 or 5 met the density threshold of 75% after the first edge reduction, necessitating a second edge reduction by image recognition program 10 according to the same edge ratio rules previously described.

FIG. 16 shows the cluster result 48 after a second edge reduction has been performed on features 1, 2, 4 and 5. New cluster number 1 shown in FIG. 16 has had edge 80 removed so that feature number 1 is now bounded by reduced P(0,0), reduced P(4,0), reduced P(0,3), and reduced P(4,3). As can be seen, edge 80 had an edge ratio of 20%. Similar edge reductions to erode the weakest edge are performed by the image recognition software 10 on features 2, 4, and 5, as shown in FIG. 16.

The image recognition software 10 now performs additional calculations on the second iteration reduced features 1, 2, 4 and 5 as shown in Table 3 in a manner similar to those performed to obtain Table 2. Note that the already calculated data for features 3 and 6 is included for reference.

TABLE 3

| FEATURE NUMBER | CODE | 2X REDUCED NUMBER OF PIXELS OF CODE TYPE (2R PIXELS) | 2X REDUCED BOUNDING BOX AREA (2R BB AREA) | SECOND REDUCTION DENSITY $\left\{\dfrac{\text{2R PIXELS}}{\text{2R BB AREA}}\right\}$ | SECOND REDUCTION RATIO $\left\{\dfrac{\text{2R PIXELS}}{\text{\# PIXELS}}\right\}$ |
|---|---|---|---|---|---|
| 1 | 0 | 12 | 20 | 60% | |
| 2 | 2 | 9 | 9 | 100% | 9/11 = 82% |
| 3 | 0 | 9 | 9 | 100% | (100%) |
| 4 | 1 | 20 | 24 | 83% | 20/24 = 83% |
| 5 | 3 | 24 | 32 | 75% | 20/32 = 75% |
| 6 | 1 | 10 | 10 | 100% | (100%) |

Table 3 shows feature number 1 as a code "0" cluster that now contains twelve code "0" pixels and twenty total pixels. The second reduction density is calculated by dividing the remaining number of code "0" pixels in the second reduced feature number 1 by the second reduced bounding box area (12/20), for a resulting second reduction density of 60%. Again, feature number 1 fails to meet the minimum density threshold of 75%.

However, unlike feature number 1, features 2, 4, and 5 have second reduction densities of greater than 75% and no further edge reduction is required for density. Now the reduction ratio becomes important. The reduction ratio is a measure of how many of the code pixels were eliminated in order to meet the density threshold. If too many of the feature code pixels were eliminated, another type of clustering must be performed. In one embodiment, the reduction ratio must exceed 75% after the density threshold has been met in order for the clustering to be complete. The reduction ratio number can be chosen empirically based on experience of an operator, or can be chosen from typical values ranging from 50%–90%.

Using feature number 2 as an example, image reduction software 10 calculates the reduction ratio as the number of code "2" pixels in the second reduced feature number 2 bounding box divided by the number of code "2" pixels in the original feature number bounding box of FIG. 14. In this case, nine code "2" pixels remain in second reduced feature number 2 and eleven code "2" pixels existed in the original feature number 2, for a reduction ratio of 82%. Since 82% exceeds the reduction ratio threshold of 75%, the second reduced feature number 2 is acceptable and requires no further manipulation or shrinking by image recognition program 10. Table 3 illustrates that the same is true for features 4 and 5 because each now has both a density and reduction ratio equal to, or in excess of, 75%. Thus, after the second edge reduction, features 2–6 have been fixed (as shown in FIG. 16). However, an additional edge reduction must be performed on feature number 1.

FIG. 17 shows the cluster result 52 after a third edge reduction has been performed on feature number 1. New feature number 1 shown in FIG. 17 has had edge 82 removed so that feature number 1 is now bounded by reduced P(0,0), reduced P(4,0), reduced P(0,2), and reduced P(4,2). Image recognition software 10 now performs the density calculations on third iteration reduced feature number 1 as shown in Table 4 (again, the previously determined data on features 2–6 is included for reference).

ware 10 now calculates the fourth reduction ratio on feature number 1 by dividing the number of code "0" pixels remaining in feature number 1 after the four edge reductions by the total number of code "0" pixels in the original feature number 1 bounding box of FIG. 14. The fourth reduction ratio for feature number 1 is 71% or (1.0/14). Since 71% does not exceed the reduction ratio threshold of 75%, the fourth reduced feature number 1 is not acceptable and further manipulation by image recognition program 10 is required. Again, the purpose of the reduction ratio is to flag when too many of the original code pixels have been lost due to edge reduction.

FIG. 19 shows the clustering result 58 that includes the clustering results for features 2–6 and the original bounding box 86 for feature number 1 (labeled 86). The image recognition software 10 can handle the original bounding box 86 in different ways. In the embodiment shown in FIG. 19, the original bounding box 86 for feature number 1 is divided along its longer axis at dividing boundary 88 as

TABLE 4

| FEATURE NUMBER | CODE | 3X REDUCED NUMBER OF PIXELS OF CODE TYPE (3R PIXELS) | 3X REDUCED BOUNDING BOX AREA (3R BB AREA) | THIRD REDUCTION DENSITY $\left(\frac{3R\ PIXELS}{3R\ BB\ AREA}\right)$ | SECOND REDUCTION RATIO $\left(\frac{3R\ PIXELS}{\#\ PIXELS}\right)$ |
|---|---|---|---|---|---|
| 1 | 0 | 11 | 15 | 73% | |
| 2 | 2 | 9 | 9 | 100% | (82%) |
| 3 | 0 | 9 | 9 | 100% | (100%) |
| 4 | 1 | 20 | 24 | 83% | (83%) |
| 5 | 3 | 24 | 30 | 75% | (75%) |
| 6 | 1 | 10 | 10 | 100% | (100%) |

Table 4 shows that feature number 1 still fails to meet the minimum density threshold of 75%. Yet another edge reduction must be performed on feature number 1.

FIG. 18 shows the cluster result 56 after a fourth edge reduction has been performed on feature number 1. New feature number 1 shown in FIG. 18 has edge 84 removed so that feature number 1 is now bounded by reduced P(0,0), reduced P(4,0), reduced P(0,1), and reduced P(4,1). Image recognition software 10 now performs the density calculations on this four times reduced feature number 1 with the results tabulated in Table 5.

shown. This dividing boundary 88 can be at the center or some other defined point along the longer axis. This results in two new sub-features, feature number 1–1 and feature number 1–2. Image recognition software 10 will now use the density thresholds, edge reduction rules and reduction ratio thresholds as previously described to reduce these new sub-clusters. As shown in TABLE 6, neither feature 1–1 nor feature 1–2 meet the minimum density threshold. In an alternative embodiment, if an original bounding box fails to meet the reduction ratio threshold, the image recognition software 10 analyzes the size of the original bounding box

TABLE 5

| FEATURE NUMBER | CODE | 4X REDUCED NUMBER OF PIXELS OF CODE TYPE (4R PIXELS) | 4X REDUCED BOUNDING BOX AREA (4R BB AREA) | FOURTH REDUCTION DENSITY $\left(\frac{4R\ PIXELS}{4R\ BB\ AREA}\right)$ | FOURTH REDUCTION RATIO $\left(\frac{4R\ PIXELS}{\#\ PIXELS}\right)$ |
|---|---|---|---|---|---|
| 1 | 0 | 10 | 10 | 100% | 10/14 71% < 75% |
| 2 | 2 | 9 | 9 | 100% | (82%) |
| 3 | 0 | 9 | 9 | 100% | (100%) |
| 4 | 1 | 16 | 18 | 83% | (83%) |
| 5 | 3 | 20 | 24 | 75% | (75%) |
| 6 | 1 | 10 | 10 | 100% | (100%) |

Table 5 shows that cluster number 1 now meets the minimum density threshold of 75% because all ten pixels in feature number 1 are now code "0". Image reduction softand if the size is less than a minimum size threshold (for example, less than 25 pixels), the image recognition software 10 can simply accept the original feature.

TABLE 6

| FEATURE NUMBER | CODE | NUMBER OF PIXELS | BOUNDING BOX AREA | RAW SPLIT DENSITY $\left(\frac{PIXELS}{BB\ AREA}\right)$ | REDUCTION RATIO |
|---|---|---|---|---|---|
| 1-1 | 0 | 11 | 15 | 73% | |
| 1-2 | 0 | 3 | 15 | 20% | |
| 2 | 2 | 9 | 9 | 100% | (82%) |
| 3 | 0 | 9 | 9 | 100% | (100%) |
| 4 | 1 | 20 | 24 | 83% | (83%) |
| 5 | 3 | 24 | 12 | 75% | (75%) |
| 6 | 1 | 10 | 10 | 100% | (100%) |

FIG. 20 shows clustering result 62 after a first edge reduction has been performed on feature 1–1 and after several edge reductions have been performed on feature 1–2 by image recognition software 10. The calculations performed by image recognition software 10 on features 1–1 and 1–2 are contained in TABLE 7. Both resulting "0" code features now have a density and reduction ratio in excess of 75%. Note that more elaborate splitting routines may be included in image recognition software 10 so that reduced P(0,2), shown as 0*, gets included in feature 1–2.

recognition software 10 to make presence/absence and polarity determinations.

The features 90 of the five spaces can now be given a "score" by the image recognition software 10. Scoring is the process of providing a relative count of the number of pixels with the specified code for that feature that are actually within the feature box. For example, the feature box 90 created from cluster number 1 of FIG. 9 is a code "0", and each code "0" pixel in FIG. 9 within feature box 90 created from cluster 1 will get counted.

TABLE 7

| FEATURE NUMBER | CODE | NUMBER OF PIXELS | BOUNDING BOX AREA | REDUCTION DENSITY | REDUCTION RATIO |
|---|---|---|---|---|---|
| 1-1 | 0 | 10 | 10 | 100% | 10/11 91% |
| 1-2 | 0 | 3 | 3 | 100% | 3/3 100% |
| 2 | 2 | 9 | 9 | 100% | (82%) |
| 3 | 0 | 9 | 9 | 100% | (100%) |
| 4 | 1 | 20 | 24 | 83% | (83%) |
| 5 | 3 | 24 | 32 | 75% | (75%) |
| 6 | 1 | 10 | 10 | 100% | (100%) |

Figure 21:
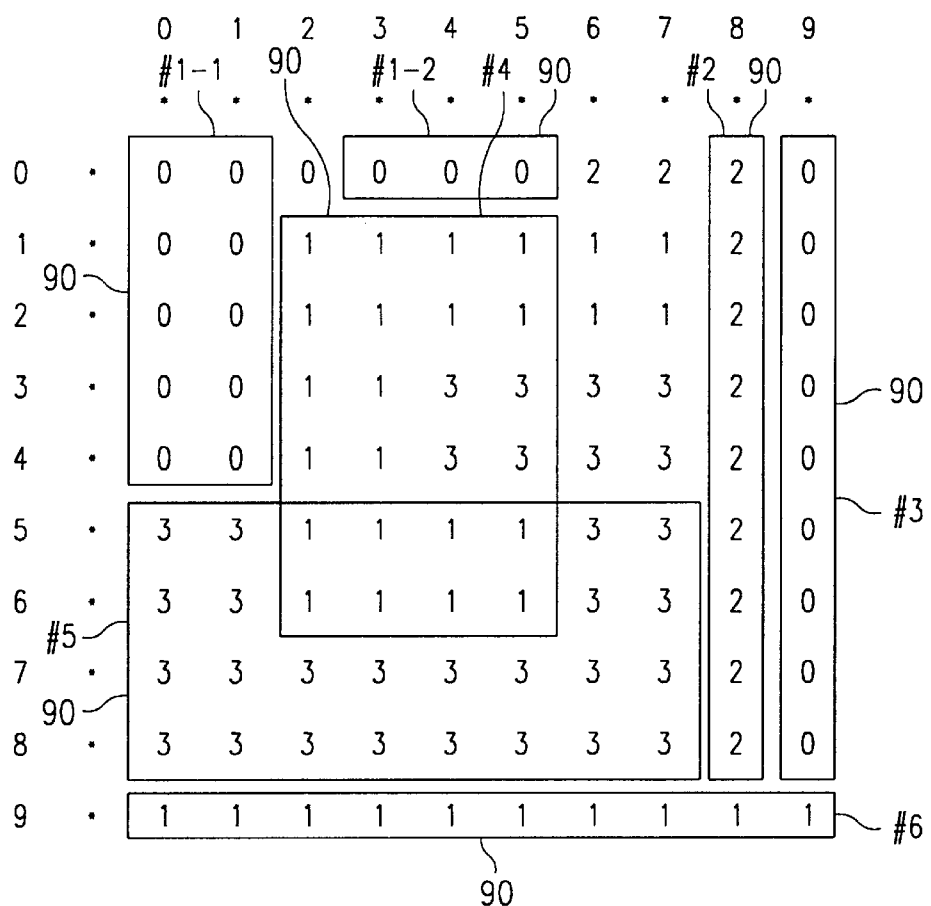
FIG. 21 is the final clustering image derived from FIG. 9 based on one embodiment of the clustering methodology of the present invention to illustrate feature generation for a region of interest.

FIG. 21 shows the final clustering result 64 that includes the bounding boxes 90 created according to the clustering rules in the described embodiment of image recognition software 10 on the reduced image 20 of FIG. 9. Table 8 shows a summary of the final tabulated and calculated values related with each of the created features of FIG. 21.

The feature scoring function performed by the image recognition software 10 of the present invention for the direction spaces (i.e., the first order direction space 40 (dir1) and the second order direction space 60 (dir2)) is done by placing each feature 90 created during clustering for these two spaces onto the appropriate direction space where that

TABLE 8

| FEATURE NUMBER | CODE | FINAL NUMBER OF PIXELS | FINAL BOUNDING BOX AREA | FINAL REDUCTION DENSITY | FINAL REDUCTION RATIO |
|---|---|---|---|---|---|
| 1-1 | 0 | 10 | 10 | 100% | 91% |
| 1-2 | 0 | 3 | 3 | 100% | 100% |
| 2 | 2 | 9 | 9 | 100% | 82% |
| 3 | 0 | 9 | 9 | 100% | 100% |
| 4 | 1 | 20 | 24 | 83% | 83% |
| 5 | 3 | 24 | 32 | 75% | 75% |
| 6 | 1 | 10 | 10 | 100% | 100% |

Figure 22:
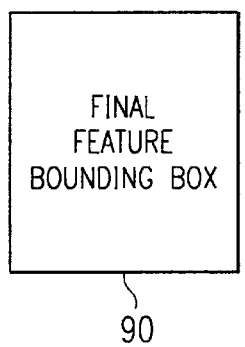
FIG. 22 is an exemplary feature bounding box resulting from clustering according to the present invention.

For the example of FIG. 21, seven features 90 were generated: feature 1–1, feature 1–2, feature 2, feature 3, feature 4, feature 5, and feature 6. The image recognition software 10 can similarly create a set of features for each of the other four spaces (reduced mag1, dir1, reduced mag2 and dir2). Features 90 (or feature boxes 90 as shown in FIG. 22) for each of the five spaces will be further manipulated by image feature is expected on the direction space and simply counting the number of pixels with the specified code. The "presence/absence" features are generated from the initial "blank" training PWA (i.e., no components assembled or assembled on the PWA), whereas the "polarity" features are generated from the initial "assembled" or assembled PWA. Once the features have been generated, the image recognition software of the present invention scores the images used to generate the features and any other training example PWAs imaged. For example, if an operator runs two blank PWAs and six assembled PWAs through an imaging system containing the image recognition software 10, the image recognition software 10 will, for presence absence: (1) generate the presence/absence features from the first blank PWA; (2) score those generated features on the first blank PWA; (3) score those same generated features on the second blank PWA by laying the features over the image of the second blank PWA; (4) score the same presence/absence features generated from the first blank PWA on the six assembled PWAs. For polarity, the image recognition software will: (1) generate the polarity features from the first assembled PWA; (2) rotate the feature images to generate "wrong" polarity features (in the preferred embodiment, the window imaged about a component is relatively narrow to minimize the impact from the board features which are not rotated); (3) score the polarity features on all eight PWAs. Thus, for each training example PWA, the images of those PWA are converted into the various spaces and then lay the features (generated in each of the five spaces from the first assembled or blank PWA for polarity and presence/absence respectively) over the five spaces and score the features based on pixel gray levels.

The image recognition software 10 scores each feature in the direction spaces according to the formula:

$$\text{SCORE}(K) = \Sigma P(i,j) \text{ for } P(i,j) \in BB_K \qquad (4)$$

where $P(i,j)=1$, if code $(P)=\text{code }(K)$ 0, if otherwise; and where K is a feature number, $BB_K$ is a bounding box bounding feature K, and $P(i,j)$ are the pixels within feature K. The score for any feature box 90 in a direction space will be precisely the number of direction codes on the image that match the direction code of the feature box 90 (as determined during clustering).

Note that the image recognition software 10 may include the ability to move the score window ±x,y, where x represents a number of pixels in the horizontal direction and y represents a number of pixels in the vertical direction, to account for lack of precise mechanical repeatability in the imaging system controlling the imaging of the PWA. In other words, the mechanical system that places the PWA in position for imaging may lack the precision to place each PWA in exactly the same position every time, thus causing movement in the x and y directions between images of the same region of interest or feature. Thus, a particular pixel (i,j) for a first PWA may not be precisely the same pixel (i,j) on a second imaged PWA. To account for this, the image recognition software 10 will score features within a scoring window of ±x,y pixels. The size of this scoring window depends entirely upon the precision of the mechanical repeatability of the imaging system. In one embodiment, the hardware repeatability was ±1 pixel in the x direction, and ±4 pixels in the y direction, so the scoring window in the image recognition software 10 was ±2 pixel in the x direction, and ±5 pixels in the y direction (which provides a safety margin of 1 pixel in each direction). For an imaging system that repeats to approximately 4 micrometers (i.e., repeatability to a fraction of a pixel), the image recognition program 10 scoring window can be ±1 pixel in both the x and y directions; or can require no movement at all (i.e., IO).

For gray level features (i.e., for reduced mag0, reduced mag1, and reduced mag2 spaces), the image recognition program 10 will score the feature 90 using the same methodology as for direction spaces, except that some pixels will not add a full integer value (for the ramp of FIG. 8, that full integer value is 5) depending on where the pixels fall on the ramp of FIG. 8. For example, for a pixel $P(i,j)$ from FIG. 7, if the raw pixel value is between 0–50, 60–125, 135–190, and 200–255, and if the code from the feature box 90 matches the code for the reduced magnitude space, the score will be increased by five. If the raw pixel value is between 50–60, 125–135, or 190–200, and the code from the feature box 90 matches the code for the reduced magnitude space, the score will be increased by a fraction of five, where the fraction is based on the raw pixels fraction above zero on the ramp. Similar to the direction scoring, if the code from the feature box 90 does not match the code for the reduced magnitude space, the score will be not be increased at all (i.e., add zero). Note that the ramp of zero to five (cf. a ramp of zero to one) was chosen for the processing compatibility with the accelerators in the preferred embodiment of the computer system 90 (Texas Instruments TMS 320C80 DSPs). Note that each feature score is based on the pixel gray levels within the feature. For example, if a feature code is "0," pixels with gray levels from 0 to 59 will add to the "0" score, while all other pixels will not.

When an assembled PWA (or an object containing components within the regions of interest) is imaged, the feature scores will move towards missing as the bare board is exposed, but will gravitate towards present when the component covers the board. In other words, when a feature is filled up with proper codes, the scores will be higher, and this implies a part is missing. The converse is true (i.e., when the scores for the features are reduced the likelihood the part is present increases). Thus, the feature scores generated by the image recognition software 10 will represent the score for a feature when it is present and a score for when the feature is absent. Similarly, a feature score will exist for right polarity and wrong polarity of the component. Note that image recognition software 10 will associate each region of interest with a set of features 90 and each feature 90 with a particular space.

Figure 23:
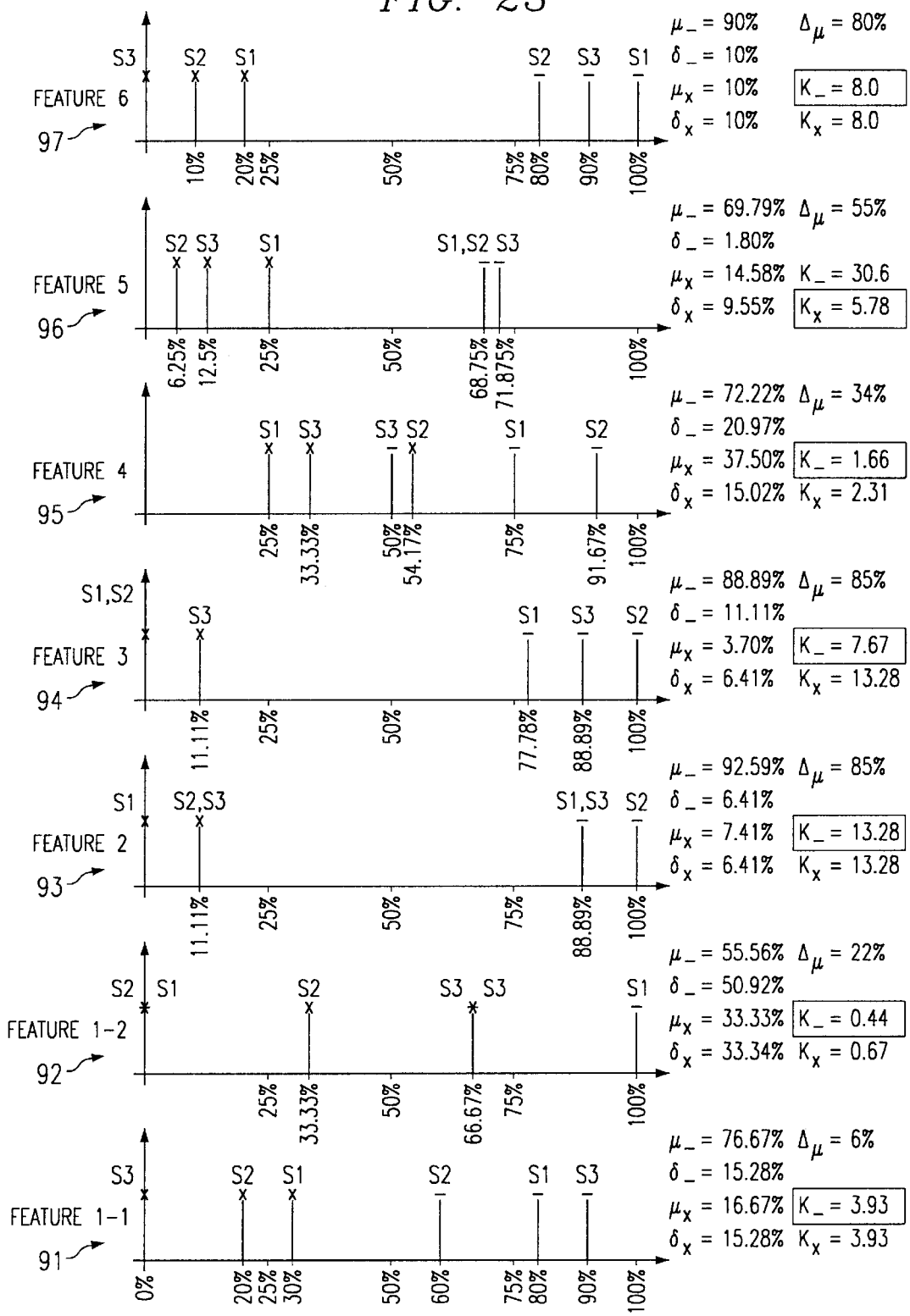
FIG. 23 is a series of number lines for each of the features generated in FIG. 21 to illustrate an embodiment of the pruning techniques of the present invention.

FIG. 23 illustrates the "pruning" function performed by the image recognition software 10 to determine which features should be used to make presence/absence determinations. The exemplary number lines for the seven features shown in FIG. 23 were based on running sample PWAs having the same regions of interest to determine if the features of FIG. 21 are repeating. Samples S1, S2, and S3 associated with a "−" symbol below them represent three samples run where the components were absent (i.e., three blank or bare boards), while the samples S1, S2, and S3 associated with a "x" symbol below them represent three samples run where the components were present (i.e., three assembled boards). FIG. 23 includes a number line for each feature 1–1 through feature 6 (items 91 through 97) that includes the score for that feature for each of the six samples. The score for each was generated using the image recognition software 10 as previously described.

Examining number line 97 for feature 6 shows that feature 6 scored as follows: the first absent sample ($S1_-$) scored 100%, the second absent sample ($S2_-$) scored 80%, and the third absent sample ($S3_-$) scored 90%; likewise, the first present sample ($S1_x$) scored 20%, the second present sample ($S2_x$) scored 10%, and the third present sample ($S3_x$) scored 0%. Note that feature 6 only contained 10 pixels, so that all scores resulted in multiples of 10%. As pixel counts within features rise, the more variability occurs within the scoring numbers. Examining number line 96 for feature 5 shows an even tighter grouping with scores as follows: the first absent sample ($S1_-$) scored 68.75%, the second absent sample ($S2_-$) scored 68.75%, and the third absent sample ($S3_-$) scored 71.875%; while the first present sample ($S1_x$) scored 25%, the second present sample (S2$_x$) scored 6.25%, and the third present sample (S3$_x$) scored 12.5%. Contrast feature 5 with feature 4 where the feature 4 third absent sample (S3) scored 50% and actually crossed over second present sample (S2$_x$) which scored 54.17%.

In order to determine the significance of the groupings for each feature, image recognition software will calculate the mean ($\mu$) and standard deviation ($\delta$) for each class (present/absent) for each feature. For feature 6, the absent class mean $\mu_-$ equals 90%, absent standard deviation $\delta_-$ equals 10%, while present class mean $\mu_x$ equals 10%, and present standard deviation $\delta_x$ equals 10%. Means and standard deviations for both classes for all other features are similarly calculated by image recognition software 10. Image recognition software 10 then calculates a pruning constant K for each class according to the following formulae:

$$K_- = (\mu_- - \mu_x)/\delta_- \quad (5)$$

$$K_x = (\mu_- - \mu_x)/\delta_x \quad (6)$$

Thus, for feature 5, absent pruning constant $K_-=30.6$ and present pruning constant $K_x=5.78$. For feature 5, the pruning constant of 30.6 means that the mean for the K class is K$_-$ separated by 30.6 standard deviations, whereas the mean for the K$_x$ class is separated by 5.78 standard deviation. Pruning constant K is a metric to rank the various features against one another in order to determine the best features to use to determine presence and absence. For each feature, the minimum pruning constant is determined and, for the example of FIG. 23, the seven minimum pruning constants are compared. The smaller the pruning constant, the worse the feature is for purposes of making presence/absence determinations. As shown in FIG. 23, feature 6 has a minimum pruning constant of 8, feature 5 has a minimum pruning constant of 5.78, feature 4 has a minimum pruning constant of 1.66, feature 3 has a minimum pruning constant of 7.67, feature 2 has a minimum pruning constant of 13.29, feature 1–2 has a minimum pruning constant of 0.44, and feature 1–1 has a minimum pruning constant of 3.93 (as indicated by the boxed values). It can be readily seen that when the classes cross (as in feature 4 and feature 1–2), the pruning constant will be relatively low, whereas when the classes maintain good separation (as in feature 2) the pruning constant will be relatively high.

The image recognition software 10 now performs the actual pruning of features to select the best features for making presence/absence determinations using a pruning rule. The pruning rule for our example having seven features will be to keep the four features that have the largest minimum pruning constants. Thus, the top four out of six features will be retained. An additional pruning rule can be incorporated to remove any features where the minimum pruning constant does not exceed 0.5. Applying these pruning rules to the features of FIG. 23 results in retaining features 2, 3, 5 and 6 for use in presence absence verification. For example, pruning rule in operating image recognition software 10 acting on PWAs will likely have pruning rules similar to: 1) remove all features with minimum pruning constants less than 0.5 and 2) keep a maximum of 50 features. The pruning constant minimum is used to obtain solid features in order to optimize performance. The maximum feature rule is used to optimize speed of operation.

At the end of the pruning function, the four remaining features and the scores of those remaining features represent the knowledge base for that imaged ROI. As more boards are run, the knowledge base can be expanded to include additional data acquired and calculated by image recognition software program 10. The knowledge bases are stored in memory accessible by image recognition software program 10. In an alternative embodiment, the features that were pruned out can be maintained in a data base for future comparison and potential inclusion in the knowledge base at a later time (e.g., if other samples cause the pruning constants of the remaining features to be lowered).

Figure 24:
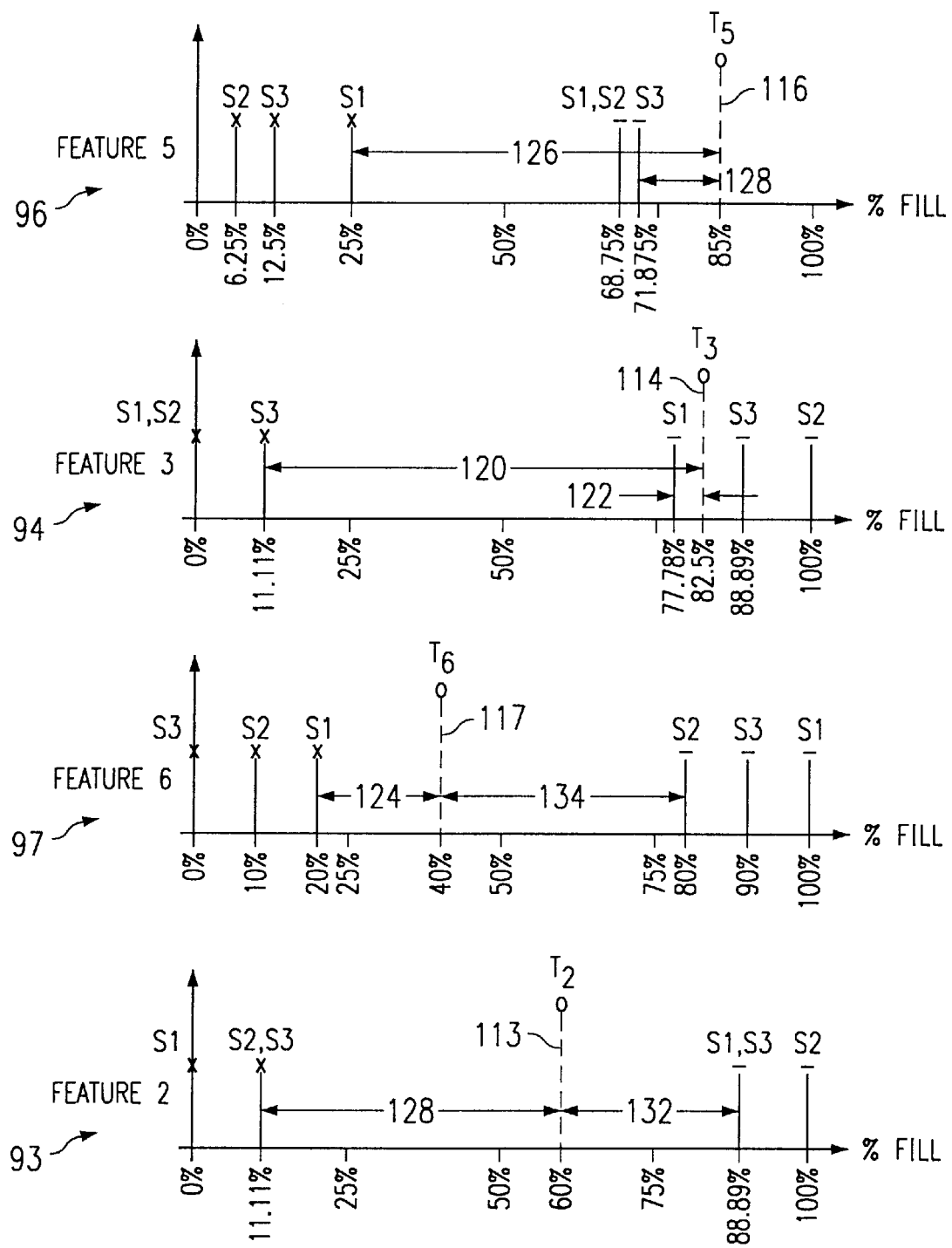
FIG. 24 shows the four number lines for the pruned features of FIG. 21 and illustrates the scoring of test features on a test region of interest to determine feature classification.

Any region of interest on a PWA or object can now be imaged by the inspection system to allow the image recognition software 10 to perform feature classification for the region of interest. Feature classification is the process of classifying the feature as present or absent (or right or wrong polarity for polarity determinations). FIG. 24 shows exemplary test image scores for each of the pruned features of FIG. 23 for a test region of interest having those pruned features. The test region of interest feature scores are overlayed on the existing knowledge base numberlines of FIG. 23. For example, test score 116 for feature 5, represented as T$_5$, is included on feature 5 number line 96, test score 114 for feature 3 is included on feature 3 number line 94, etc. Image recognition software 10 will determine the minimum distance between the test score value and a sample score for each class (from the knowledge base). The image recognition software 10 will call the test feature present if the test feature score is closer to the present sample, or absent if the test score is closer to the absent sample.

To illustrate, feature 5 number line 96 shows that feature 5 test score 116 is 85%. The closest absent feature 5 score (an S$_-$ score) is the S3 score of 71.875%, while the closest present feature 5 score (an S$_x$ score) is the S1$_x$ score of 25%. The minimum test-to-absent class score for feature 5 (indicated by item 128) is (85−71.875) which equals 13.125, while the minimum test-to-present class score for feature 5 (indicated by item 126) is 85−25 which equals 60. The image recognition software 10 has determined that the test feature 5 score lies closer to the absent sample scores (because 13.125 is less than 60). Thus, the feature 5 class decision 128 is "13.125 absent". Similarly, test feature 3 score 114 has a minimum distance 120 to closest present sample feature 3 score and minimum distance 122 from the closest absent sample feature 3 score. Test-to-present distance 120 for feature 3 is 71.39, while test-to-absent distance 122 is 4.72. A similar calculation can be performed by image recognition software 10 on each test feature score relative to every feature that is kept after pruning (in our example, features 2, 3, 5 and 6). In our example test image, test feature 6 has a test-to-present distance 124 of 20 and a test-to-absent distance 134 of 40, while test feature 2 has a test-to-present distance 128 of 48.89 and a test-to-absent distance 132 of 28.89. These calculations are shown in Table 9.

TABLE 9

| FEATURE SET | CLASS CALCULATION X | | CLASS MINIMUM | CLASS DECISION |
|---|---|---|---|---|
| F$_2$ | 48.89 (60.00−11.11) | 28.89 (88.89−60.00) | 28.89 | (—) ABSENT |
| F$_6$ | 20 (40.00−20.00) | 40 (80.00−40.00) | 20 | (X) ABSENT |
| F$_3$ | 71.39 (82.50−11.1) | 4.72 (82.50−77.78) | 4.72 | (—) ABSENT |
| F$_5$ | 60 (85.00−25.00) | 13.125 (85.00−71.875) | 13.125 | (—) ABSENT |

An interesting point on these exemplary test region of interest scores is that three of the four distances indicate the feature is absent, while the fourth (feature 6) indicates the feature is present. In order to make an overall class determination (present versus absent) for the region of interest, the image recognition software 10 further manipulates these distance determinations.

The image recognition software 10 now takes these individual test-to-class feature distances for the features that are kept after pruning (in our example, features 5, 3, 6 and 2, having test-to-class feature distances 126, 128, 120, 122, 124, 134, 128 and 132) and manipulates them using some metric to determine whether the component made up by these features is present or absent. Image recognition software 10 can perform a calculation to determine the net Euclidean distance for the entire region of interest (ROI $D_i$) from the features to the classes according to the formula:

$$\left(\frac{1}{N}\sum_{1}^{N} D_i^2\right)^{1/2} = ROI\ D_i \quad (7)$$

where i is the class, N is the total number of individual features and $D_i$ represents the test-to-sample feature distances for the class. Thus, the ROI $D_i$ Euclidean Distance is determined for the region of interest for both absent and present classes. For any region of interest, the image recognition software 10 will place the region of interest in the class associated with the minimum Euclidean distance between the region of interest test scores and the absent/present class scores. For our example, the absent Euclidean distance $ED_-$ is 25.638, while the present Euclidean distance $ED_x$ is 53.588. For the region of interest of our example, the minimum Euclidean distance of 25.638 is associated with an absent class, therefore the image recognition software would determine the component in the region of interest is absent. It should be understood that any number of metrics could be used to determine the region of interest class rather than the Euclidean distance (for example, the standard deviation of the Euclidean distance). In an alternative embodiment, the Euclidean norm (or other metric) could be used as the metric.

A class determination has now been performed for each of the individual features and the overall region of interest made up from those features. The image recognition software 10 can now perform a decision confidence calculation to determine a confidence factor for each of these class determinations. Decision confidences are calculated from the formulae:

FEATURE CONFIDENCE (%)=[MAX $D_i/(D_-+D_x)$]*100 (8)

(where MAX $D_i$ is the maximum of $D_-+D_x$ for each feature)
for the individual feature decision confidences and:

ROI CONFIDENCE (%)=[MAX $ED_i/(ED_-+ED+i]$*100 (9)

(where MAX $ED_i$ is the maximum of ROI $D_-$ or ROI $D_x$)
Thus, the decision confidence is a ratio of the distances between the test scores and the present/absent scores in the knowledge base. For the example of FIG. 24, the region of interest decision confidence is calculated as [53.588/(53.588+25.638)] which equals 67.64%. All of the class determinations and decision confidences for both the individual features and the overall component are provided in TABLE 10.

TABLE 10

| FEATURE SET | $D_-$ | $D_x$ | CLASS$_{MIN}$ | DECISION CONFIDENCE |
|---|---|---|---|---|
| $F_2$ | 28.89 | 48.89 | — | 62.86% |
| $F_6$ | 40 | 20 | X | 66.67% |
| $F_3$ | 4.72 | 71.39 | — | 93.80% |
| $F_5$ | 13.125 | 60 | — | 82.05% |
| OVERALL ROI | 25.638 | 53.588 | — | 67.64% |

Table 10 illustrates that for the test region of interest imaged against the four features in the knowledge base, the image recognition software 10 decided the overall class for the region of interest was absent with a decision confidence of 67.64%. Under the methodology described above, a decision confidence could never fall below 50% or be above 100%. To further illustrate, a decision confidence of 50% indicates the test score was an equal distance from either class; a decision confidence of 66.67% is a metric indicating that the test score was twice as close to one class as the other; a confidence of 75% indicates the test score was three times closer to one class than the other; a confidence of 90% indicates the test score was nine times closer to one class than the other.

In one embodiment of the image recognition program 10 of the present invention, any individual test region of interest result (e.g., those contained in Table 10) can be added to the knowledge base to increase the data available in the knowledge base. The decision to add a particular test result to the knowledge base could be made and executed by an operator manually, or could be performed automatically for all test results having a decision confidence that falls below a predetermined threshold.

Another aspect of the present invention is to provide, in addition to the class decision and the decision confidence, a relative confidence value and an extended confidence value. The relative confidence compares the feature class decisions and feature confidences to the overall ROI class decision and ROI decision confidence. The relative confidence value serves to provide another measure of confidence to prevent defects from escaping the image recognition program 10. In our example of Table 10, despite the overall absent class determination for the region of interest, feature 6 actually had a present class determination at a confidence level of 66.67%. This toggling from absent to present between features indicates that while this region of interest appears not to have a component at features 2, 3, and 5, there does appear to be a component at region 6. In other words, a component has extended to an area (encompassed by feature 6) that it typically does not occupy. This could occur, for example, with a damaged component. However, the overall effect of the feature 6 "present" decision was not enough to toggle the entire decision to "present", but the effect was to lower the overall decision confidence. For example, if the decision confidence for this region of interest based on these four features is typically 90%, then feature 6 would typically give an absent class when features 2, 3 and 5 do. Therefore, this example would be classified as absent, but would not behave as a typical absent classification would (i.e., the confidence is low) and could therefore represent a defect.

In order to protect against defect escapes such as described above, the image recognition software 10 compares the overall region of interest decision confidence to the typical decision confidence for that region of interest from previous runs. If the overall ROI decision confidence is too far from the typical ROI decision confidence, the image recognition program 10 flags it as a relative confidence error that must be investigated further. In one embodiment, the image recognition program 10 will flag a relative confidence error if the overall ROI decision confidence is greater than or less than the mean of the previous ROI decision confidences plus or minus some number of standard deviations as illustrated by the following formula:

$$\text{IF } DC > \text{ or } < (\mu^N \pm k\delta^N) \Rightarrow RCE \tag{10}$$

where DC is the decision confidence value of interest, $\mu$ is the mean decision confidence calculated from a floating window of the previous N decision confidence values for the region of interest, $\delta$ is the standard deviation of the decision confidence calculated from the same N values, k is a constant, and RCE is a relative confidence error. The mean and standard deviation can be calculated over a floating number of previous ROI decision confidences (N) that can be operator selectable. For example, in one embodiment the previous 50–100 decision confidence values are used to calculate the mean and standard deviation. The constant k simply defines how many standard deviations away from the mean an acceptable new decision confidence can be without flagging a relative decision confidence error.

Figure 25A:
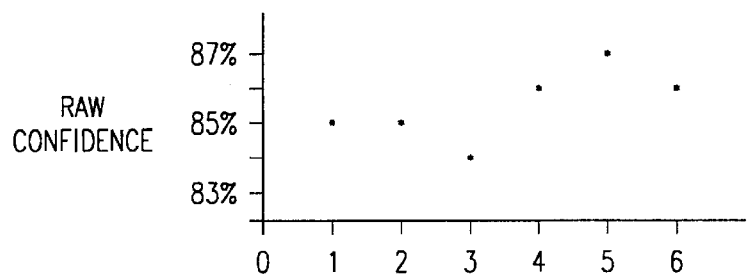
FIGS. 25A and 25B includes exemplary graphs of raw confidence values and relative confidence upper and lower bounds to illustrate relative confidence error boundary determination.
Figure 25B:
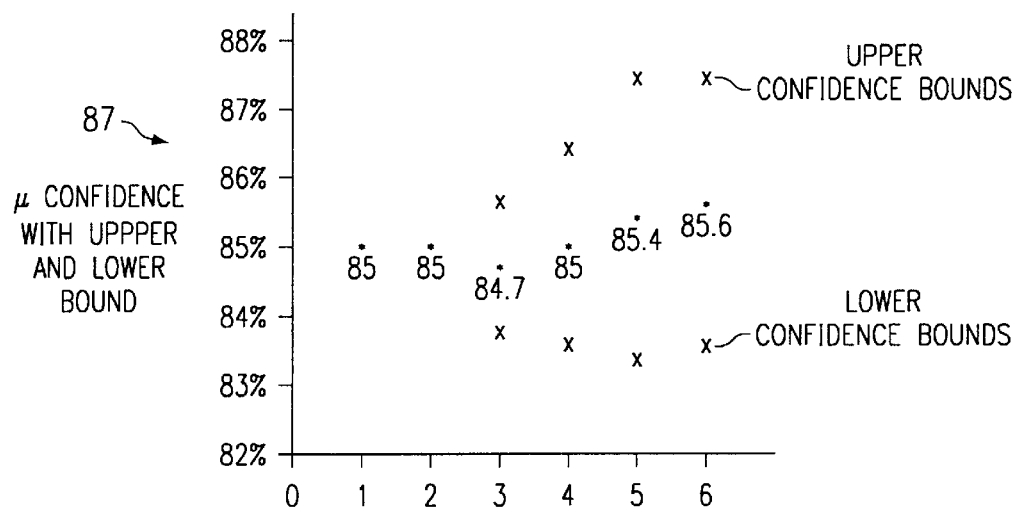

FIG. 25A is a graph showing six consecutive decision confidence values for a particular region of interest. FIG. 25B is a graph illustrating the floating window relative confidence calculations performed by the image recognition software 10 of the present invention. With reference to FIGS. 25A and 25B, the relative confidence bounds are calculated with a floating window of N=5 and a constant k=2, with the results contained in Table 11. The first and second ROI decision confidence values are 85% so that the upper and lower bounds for determining relative confidence errors is zero. After the third ROI decision of 84%, the upper and lower bounds within with an ROI decision will not be flagged as a relative confidence error are 85.6 and 83.8 which are calculated from all three ROI decision confidences. This continues through the first five decision confidences. At the sixth ROI decision confidence, the first RIO decision confidence is dropped out and only the second through sixth ROI decision confidences remain within the floating window and are used to calculate the upper and lower relative decision confidence bounds. The results of the calculations are shown in TABLE 11.

TABLE 11

| FLOATING MEAN ($\mu$) (N = 5) | STANDARD DEVIATION ($\delta$) | $k\delta$ (k = 2) | UPPER BOUND ($\mu + k\delta$) | LOWER BOUND ($\mu - k\delta$) |
| --- | --- | --- | --- | --- |
| $\mu_1$ = 85 | 0 | $2\delta$ = 0 | 85 | 85 |
| $\mu_2$ = 85 | 0 | $2\delta$ = 0 | 85 | 85 |
| $\mu_3$ = 84.7 | .47 | $2\delta$ = 0.94 | 85.7 | 83.8 |
| $\mu_4$ = 85 | .71 | $2\delta$ = 1.42 | 86.4 | 83.6 |
| $\mu_5$ = 85.4 | 1.02 | $2\delta$ = 2.0 | 87.4 | 83.4 |
| $\mu_6$ = 85.6 | 1.02 | $2\delta$ = 2.0 | 87.6 | 83.6 |

Figure 26:
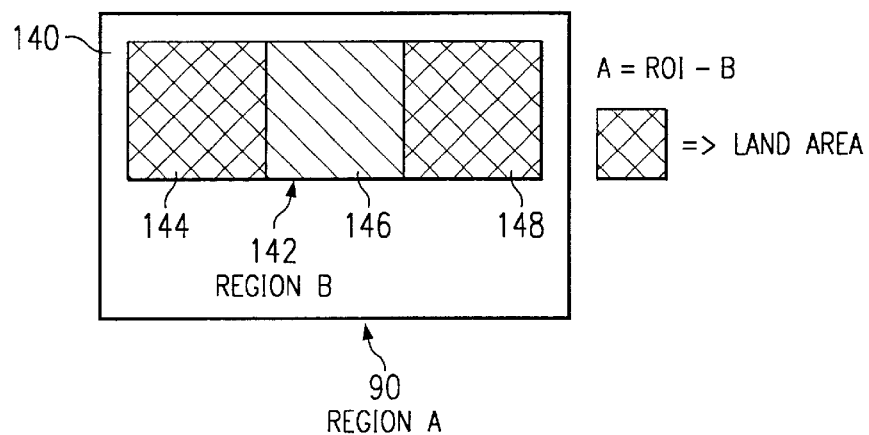
FIG. 26 is an exemplary region of interest that illustrates the extended relative confidence methodology of the present invention.

The extended relative confidence goes beyond the relative confidence analysis to spatially cluster the individual feature decision confidences for a region of interest to make a determination of the type or subclassification of defect present based on the relative confidence errors. FIG. 26 shows an ROI 90 to which the image recognition software 10 will apply spatial heuristic rules to determine the defect subclassification. The defect subclassifications that can be determined using the present invention include but are not limited to critically skewed components, tombstoned components, billboarded components, damaged components, wrong components, upside down components, and foreign material on the ROI. The image recognition software 10 can determine which of these various component level defects exist by examining the area immediately outside the component body 140 (Region A) and the component body area 142 (Region B).

For a critically skewed component, the feature boxes in Region A show a deviation from normal scores (in other words, feature boxes in Region A should generate similar scores when the component is both present and absent, and different scores if the component is present, but skewed) and the feature boxes in Region B tend towards lower confidence present scores to higher confidence absent scores. Critically skewed components result in a structured distribution of clusters in both Region A and Region B. For tombstoned components, the feature boxes in Region A show normal scores, while feature boxes in Region B tend towards low-confidence present to high-confidence absent scores along the minor edge of Region B spreading towards the center of the component. Tombstoned components results in a structured distribution of clusters in Region B. For billboarded components, the feature boxes in Region A show normal scores, while feature boxes in Region B tend towards low confidence present to high confidence absent scores along a major edge of Region B spreading towards the center. Like tombstoned components, billboarded components result in a structured distribution of clusters in Region B. For damaged components, the feature boxes in Region A show normal scores, while the feature boxes in Region B tend toward low-confidence present to high-confidence absent scores in the damaged areas. Damaged components typically result in an unstructured distribution of clusters in Region B. For wrong or incorrect components, the feature boxes in Region A will show normal scores, while feature boxes in Region B tend toward low-confidence present to high-confidence absent scores. Wrong components result in a semi-structured distribution of clusters in Region B. For foreign material in Region B, the feature boxes in Region A show normal scores, while the feature boxes in Region B tend toward low-confidence present to high-confidence absent scores in the area of foreign material. Foreign material in Region B results in an unstructured distribution of clusters in Region B. For foreign material in Region A, the feature boxes in Region A show a deviation from normal scores in the foreign material area, while the feature boxes in Region B show normal scores. Foreign material in Region A results in an unstructured distribution of clusters in Region A. In all of the cases described, some number of feature boxes in both Region A and Region B will almost certainly show normal scores even when a defect is present. It is the tendencies described above that allow the present invention to subclassify a presence/absence defect into one of the above subclasses.

FIG. 26 shows a particular example of how the extended relative confidence analysis is performed by the image recognition software 10 of the present invention. As can be seen in FIG. 26, the region of interest 90 is composed of the component body 142 Region B plus an area outside the component body Region A so that Region A +Region B represents the entire region of interest. Region B, the component body 142, also includes three sub-regions 144, 146, and 148. As shown in FIG. 26, sub-regions 144 and 1148 represent land area and sub-region 146 represents non-land area. "Land areas" are the electrical bonding areas.

To further illustrate the benefits of relative confidence and extended relative confidence analyses performed by the present invention, assume a component is present, but skewed from its normal location. The image recognition software 10 will examine the features and will classify most of the features for the region of interest containing the component as present, while a few features will be classified as absent (because the component is skewed and these features have been uncovered), though the overall class decision will be present. The relative confidence analysis will then show a decision confidence value outside the normal decision confidence values and the image will be flagged for low (or high) confidence that exceeds the confidence window (IKT), which indicates a relative confidence error. The operator can now go examine the component, determine it is skewed and repair the problem. However, the extended relative confidence goes beyond the relative confidence analysis to spatially group the feature decision confidences for the region of interest to actually classify that the part was skewed. The manufacturing process can see tremendous benefit from tracking the types/subclassifications of defects present.

FIG. 27 shows a listing of pseudo-code 150 for one embodiment of the image recognition software 10 of the present invention. The pseudo-code 150 includes a feature space generation subroutine 152, a color reduction subroutine 154, a feature generation subroutine 156, a feature vector subroutine 158, a defect classification subroutine 160, a relative confidence subroutine 162, and an extended relative confidence analysis 164. The pseudo-code 150 further illustrates the image recognition and defect classification methodology of one embodiment of the present invention.

Although the present invention has been described in detail, it should be understood that various changes, substitutions and alterations can be made hereto without departing from the spirit and scope of the invention as described by the appended claims.

What is claimed is:

1. A method for performing basic training in a dynamic image recognition system, comprising:
   collecting raw image data from at least one blank object;
   segmenting out a region of interest on the at least one blank object;
   performing at least one spatial image transform to generate a set of derived spaces for the region of interest;
   generating a set of presence/absence features for the at least one blank object, comprising;
      spatially clustering similar presence/absence pixel codes in each derived space to create a set of presence/absence features; and
      representing each significant presence/absence feature as one or more presence/absence boxes;
   scoring each presence/absence box on each blank object, thereby building a blank object presence/absence score set;
   collecting raw image data from at least one assembled object;
   segmenting out a region of interest on the at least one assembled object;
   performing at least one spatial image transform to generate a set of derived spaces for the region of interest;
   scoring each present/absence box on each assembled object, thereby building an assembled board presence/absence score set;
   building a presence/absence knowledge base using the blank object presence/absence score set and the assembled object presence absence score set;
   pruning each presence/absence box;
   generating a set of polarity features from a first assembled object, comprising;
      spatially clustering similar polarity pixel codes in each derived space to create at least one polarity feature; and
      representing each significant polarity feature as one or more polarity boxes;
   scoring each polarity box on each assembled object, thereby building an assembled object score set;
   building a polarity knowledge base using the assembled object score set; and
   pruning each polarity box.

2. The method of claim 1 further comprising performing inspection of an object, comprising:
   collecting raw image data from the object;
   segmenting out a region of interest on the object;
   performing at least one spatial image transform to generate a set of derived spaces for the region of interest;
   generating a set of presence/absent feature boxes and a set of polarity feature boxes for the object;
   determining the presence and or absence of each feature within the set of feature boxes, comprising;
      scoring the presence/absence feature boxes for the object;
      passing the presence/absence feature box scores for the object through the presence absence knowledge base;
      calculating a presence/absence decision confidence for each feature;
      calculating a presence/absence relative confidence for each feature to provide a metric to compare each presence/absence decision confidence for each feature to a set of past presence/absence decision confidences for each feature;
      if the relative decision confidence is outside of a predetermined window, classify the feature as a defect and performing an extended presence/absence relative confidence analysis to subclassify the defect.

3. The method of claim 2, further comprising:
   determining the polarity of each feature within the set of feature boxes, comprising
      scoring each polarity feature box;
      passing each polarity feature box score through the polarity knowledge base, comprising;
      generating a polarity decision confidence for each feature;
      calculating a polarity relative decision confidence for each feature to provide a metric to compare each polarity confidence for each feature to a set of past polarity decision confidences for each feature;
      if the polarity relative decision confidence is outside of a predetermined window, classify the feature as a defect.

4. The method of claim 3, further comprising performing incremental training to update the presence/absence and polarity knowledge bases.

5. The method of claim 2, wherein the presence/absence defect subclassifications include skewed, tombstoned, billboarded, damaged, new, and wrong components and foreign material.

6. The method of claim 2, wherein performing a presence/absence relative confidence analysis to detect presence/absence component level defects further comprises:
   computing a mean ($\mu$) and standard deviation ($\delta$) over a sliding window of the presence/absence decision confidences; and
   flagging any presence/absence decision having a confidence level outside a predetermined window.

7. The method of claim 6, wherein the predetermined window includes values of $\mu \pm k\delta$ where k is a relative confidence flag boundary.

8. The method of claim 2, wherein the step of performing an extended presence/absence confidence analysis to subclassify the defects further comprises:

for each presence/absence box, determining a presence/absence classification and computing a presence/absence confidence for each feature box;

spatially clustering similar confidence feature boxes; and applying spatial heuristic rules to each feature box cluster to determine presence/absence defect subclassifications.

9. The method of claim 8, wherein the presence/absence defect subclassifications include skewed, tombstoned, billboarded, damaged, new, and wrong components, and foreign material.

10. The method of claim 9, wherein the features comprise an arbitrary geometry.

11. A system for performing basic training in a dynamic image recognition system, comprising:

a processor; and a training computer software program stored in computer-readable form on a storage medium and executable to:

collect raw image data from at least one blank object;

segment out a region of interest on the at least one blank object;

perform at least one spatial image transform to generate a set of derived spaces for the region of interest;

generate a set of presence/absence features for the at least one blank object, comprising;

spatially clustering similar presence/absence pixel codes in each derived space to create a set of presence/absence features; and representing each significant presence/absence feature as one or more presence/absence boxes;

score each presence/absence box on each blank object, thereby building a blank object presence/absence score set;

collect raw image data from at least one assembled object;

segment out a region of interest on the at least one assembled object;

perform at least one spatial image transform to generate a set of derived spaces for the region of interest;

score each present/absence box on each assembled object, thereby building an assembled board presence/absence score set;

build a presence/absence knowledge base using the blank object presence/absence score set and the assembled object presence absence score set;

prune each presence/absence box;

generate a set of polarity features from a first assembled object, comprising;

spatially clustering similar polarity pixel codes in each derived space to create at least one polarity feature; and representing each significant polarity feature as one or more polarity boxes;

score each polarity box on each assembled object, thereby building an assembled object score set;

build a polarity knowledge base using the assembled object score set; and prune each polarity box.

12. The system of claim 11, further comprising an inspection software program stored on a tangible storage medium and executable to perform inspection of an object by:

collecting raw image data from the object;

segmenting out a region of interest on the object;

performing at least one spatial image transform to generate a set of derived spaces for the region of interest;

generating a set of presence/absent feature boxes and a set of polarity feature boxes for the object;

determining the presence and or absence of each feature within the set of feature boxes, comprising;

scoring the presence/absence feature boxes for the object;

passing the presence/absence feature box scores for the object through the presence absence knowledge base;

calculating a presence/absence decision confidence for each feature;

calculating a presence/absence relative confidence for each feature to provide a metric to compare each presence/absence decision confidence for each feature to a set of past presence/absence decision confidences for each feature; and if the relative decision confidence is outside of a predetermined window, classify the feature as a defect and performing an extended presence/absence relative confidence analysis to subclassify the defect.

13. The system of claim 12, wherein the inspection program is further executable to:

determine the polarity of each feature within the set of feature boxes by:

scoring each polarity feature box;

passing each polarity feature box score through the polarity knowledge base, comprising;

generate a polarity decision confidence for each feature;

calculate a polarity relative decision confidence for each feature to provide a metric to compare each polarity confidence for each feature to a set of past polarity decision confidences for each feature; and if the polarity relative decision confidence is outside of a predetermined window, classify the feature as a defect.

14. The system of claim 13, wherein the training program is further executable to perform incremental training to update the presence/absence and polarity knowledge bases.

15. The system of claim 12, wherein the inspection program is further executable to perform a presence/absence relative confidence analysis to detect presence/absence component level defects by:

computing a mean ($\mu$) and standard deviation ($\delta$) over a sliding window of the presence/absence decision confidences; and flagging any presence/absence decision having a confidence level outside a predetermined window.

16. The system of claim 15, wherein the predetermined window includes values of $\mu+k\delta$ where k is a relative confidence flag boundary.

17. The system of claim 12, wherein the inspection program is further executable to perform an extended presence/absence confidence analysis to subclassify the defects by:

for each presence/absence box, determining a presence/absence classification and computing a presence/absence confidence for each feature box;

spatially clustering similar confidence feature boxes; and applying spatial heuristic rules to each feature box cluster to determine presence/absence defect subclassifications.

* * * * *